US012660352B2

(12) United States Patent

Hiramitsu et al.

(10) Patent No.: US 12,660,352 B2

(45) Date of Patent: Jun. 16, 2026

(54) OPTICAL SENSOR

(71) Applicant: HAMAMATSU PHOTONICS K.K., Hamamatsu (JP)

(72) Inventors: Jun Hiramitsu, Hamamatsu (JP); Mitsuhito Mase, Hamamatsu (JP); Akihiro Shimada, Hamamatsu (JP); Hiroaki Ishii, Hamamatsu (JP); Toshinori Ito, Hamamatsu (JP); Yuma Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 829 days.

(21) Appl. No.: 17/922,803

(22) PCT Filed: Jan. 12, 2021

(86) PCT No.: PCT/JP2021/000705

§ 371 (c)(1),
(2) Date: Nov. 2, 2022

(87) PCT Pub. No.: WO2021/225015

PCT Pub. Date: Nov. 11, 2021

(65) Prior Publication Data

US 2023/0223418 A1 Jul. 13, 2023

(30) Foreign Application Priority Data

May 8, 2020 (JP) ................................ 2020-082444

(51) Int. Cl.
H10F 39/00 (2025.01)
H10F 30/225 (2025.01)

(52) U.S. Cl.
CPC ......... H10F 39/807 (2025.01); H10F 30/225 (2025.01)

(58) Field of Classification Search
CPC ............................ H10F 30/225; H10F 77/959
See application file for complete search history.

(56) References Cited

U.S. PATENT DOCUMENTS

2019/0006399 A1    1/2019  Otake et al.
2019/0157323 A1    5/2019  Ogi et al.
2020/0105804 A1*   4/2020  Iwata ................... H10F 39/807

FOREIGN PATENT DOCUMENTS

CN    101484999 A    7/2009
CN    107946326 A    4/2018
(Continued)

OTHER PUBLICATIONS

International Preliminary Report on Patentability mailed Nov. 17, 2022 for PCT/JP2021/000705.

*Primary Examiner* — Thanh Luu

(74) *Attorney, Agent, or Firm* — Faegre Drinker Biddle & Reath LLP

(57) ABSTRACT

An optical sensor includes an avalanche multiplication region including a first multiplication region having a first conductive type and a second multiplication region having a second conductive type, each of the first multiplication region and the second multiplication region being formed in a layer shape, a charge collection region having the second conductive type disposed on a first side of the second multiplication region, and a first conductive region having the first conductive type disposed on the first side of the second multiplication region. The second multiplication region has a first portion overlapping the charge collection region in a thickness direction of the first multiplication region and the second multiplication region and a second portion overlapping the first conductive region in the thickness direction. A concentration of impurities in the first portion is higher than a concentration of impurities in the second portion.

22 Claims, 16 Drawing Sheets

(56)     References Cited

FOREIGN PATENT DOCUMENTS

| | | | |
|----|----|----|----|
| JP | H06-224463 | A | 8/1994 |
| JP | 2009-014460 | A | 1/2009 |
| JP | 2012-054478 | A | 3/2012 |
| JP | 2018-157156 | A | 10/2018 |
| JP | 2018-530176 | A | 10/2018 |
| JP | 2019-004149 | A | 1/2019 |
| KR | 20100033368 | | 3/2010 |
| WO | WO-2008/004547 | A1 | 1/2008 |
| WO | WO-2017/004663 | A1 | 1/2017 |
| WO | WO-2017/043068 | A1 | 3/2017 |
| WO | WO-2018/174090 | A1 | 9/2018 |

* cited by examiner (a)

OPTICAL SENSOR

TECHNICAL FIELD

An aspect of the present disclosure relates to an optical sensor.

BACKGROUND ART

Patent Literature 1 describes an optical sensor using avalanche multiplication. In such an optical sensor, a voltage is applied between a front surface and a back surface of a substrate to cause avalanche multiplication in an avalanche multiplication region. As a result, electrons generated in the substrate are multiplied, and light detection sensitivity is enhanced.

CITATION LIST

Patent Literature

Patent Literature 1: International Publication WO. 2017/043068

SUMMARY OF INVENTION

Technical Problem

In the optical sensor described above, in addition to a charge collection region where multiplied charges are collected, a region having a conductive type different from that of the charge collection region (hereinafter, referred to as a hetero-conductive region) may be provided. In this case, a depletion layer is more likely to spread in a portion of the avalanche multiplication region overlapping the hetero-conductive region than in a portion thereof overlapping the charge collection region. Thus, there is concern that an electric field generated in the avalanche multiplication region when a voltage is applied may become non-uniform. If the electric field is non-uniform, for example, when the applied voltage is increased to an extent that avalanche multiplication occurs, joint fracture may occur in a portion located below the charge collection region.

An aspect of the disclosure is to provide an optical sensor capable of uniformizing the electric field in the avalanche multiplication region.

Solution to Problem

An optical sensor according to an aspect of the disclosure includes an avalanche multiplication region including a first multiplication region having a first conductive type and a second multiplication region having a second conductive type, each of the first multiplication region and the second multiplication region being formed in a layer shape, a charge collection region having the second conductive type disposed on a first side of the second multiplication region when a side at which the second multiplication region is located with respect to the first multiplication region in a thickness direction of the first multiplication region and the second multiplication region is set as the first side, and a first conductive region having the first conductive type disposed on the first side of the second multiplication region, in which the second multiplication region includes a first portion overlapping the charge collection region in the thickness direction and a second portion overlapping the first conductive region in the thickness direction, and a concentration of impurities in the first portion is higher than a concentration of impurities in the second portion.

In this optical sensor, the second multiplication region has a first portion overlapping the charge collection region in the thickness direction and a second portion overlapping the first conductive region in the thickness direction, and a concentration of impurities in the first portion is higher than a concentration of impurities in the second portion. In this way, the depletion layer may be easily extended in the first portion, and an electric field generated in the avalanche multiplication region when a voltage is applied may be uniformized.

The first multiplication region may overlap the charge collection region and the first conductive region in the thickness direction. In this case, the area of the first multiplication region may be ensured, and high sensitivity may be achieved.

An optical sensor according to an aspect of the disclosure includes an avalanche multiplication region including a first multiplication region having a first conductive type and a second multiplication region having a second conductive type, each of the first multiplication region and the second multiplication region being formed in a layer shape, a charge collection region having the second conductive type disposed on a first side of the second multiplication region when a side at which the second multiplication region is located with respect to the first multiplication region in a thickness direction of the first multiplication region and the second multiplication region is set as the first side, and a first conductive region having the first conductive type disposed on the first side of the second multiplication region, in which the first multiplication region includes a first portion overlapping the charge collection region in the thickness direction of the first multiplication region and the second multiplication region and a second portion overlapping the first conductive region in the thickness direction, and a concentration of impurities in the second portion is higher than a concentration of impurities in the first portion.

In this optical sensor, the first multiplication region has a first portion overlapping the charge collection region in the thickness direction and a second portion overlapping the first conductive region in the thickness direction, and a concentration of impurities in the second portion is higher than a concentration of impurities in the first portion. In this way, extension of the depletion layer in the second portion may be suppressed, and an electric field generated in the avalanche multiplication region when a voltage is applied may be uniformized.

The second multiplication region may overlap the charge collection region and the first conductive region in the thickness direction. In this case, the area of the second multiplication region may be ensured, and high sensitivity may be achieved.

An optical sensor according to an aspect of the disclosure may include a plurality of pixels, each of the pixels including the avalanche multiplication region, the charge collection region, and the first conductive region, in which the first multiplication region may be connected across the plurality of pixels or reach a trench formed so as to separate the plurality of pixels from each other. In this case, high sensitivity is realized in each pixel in a state where variation in light receiving sensitivity among the plurality of pixels and variation in light receiving sensitivity depending on the location in one pixel are suppressed. As a result, light receiving sensitivity may be uniformly improved in each pixel.

An optical sensor according to an aspect of the disclosure may include a plurality of pixels, each of the pixels including the avalanche multiplication region, the charge collection region, and the first conductive region, in which the second multiplication region may be connected across the plurality of pixels or reach a trench formed so as to separate the plurality of pixels from each other. In this case, high sensitivity is realized in each pixel in a state where variation in light receiving sensitivity among the plurality of pixels and variation in light receiving sensitivity depending on the location in one pixel are suppressed. As a result, light receiving sensitivity may be uniformly improved in each pixel.

The first portion may not overlap the first conductive region in the thickness direction. In this case, it is possible to inhibit occurrence of a situation (punch-through) in which a current flows between the avalanche multiplication region and the first conductive region due to the depletion layer reaching the first conductive region when a voltage is applied.

The first portion may overlap the first conductive region in the thickness direction. In this case, the electric field in the avalanche multiplication region may be further uniformized.

The first conductive region may be a well region that forms a circuit. According to this optical sensor, even when such a well region is provided, the electric field in the avalanche multiplication region may be uniformized.

An optical sensor according to an aspect of the disclosure may include a plurality of pixels, each of the pixels including the avalanche multiplication region, the charge collection region, and the first conductive region, in which the first conductive region may be a separation region provided at a boundary portion between the plurality of pixels. According to this optical sensor, even when such a separation region is provided, the electric field in the avalanche multiplication region may be uniformized.

The first conductive region may surround the charge collection region when viewed in the thickness direction. According to this optical sensor, even when such a first conductive region is provided, the electric field in the avalanche multiplication region may be uniformized.

An optical sensor according to an aspect of the disclosure may further include an electrode disposed on the first side of the charge collection region, and an intervening region having the first conductive type disposed between the charge collection region and the electrode. In this case, generation of dark current around the electrode may be suppressed.

An optical sensor according to an aspect of the disclosure may further include a charge transfer region having the second conductive type disposed on the first side of the second multiplication region and connected to the charge collection region, and a transfer gate electrode disposed on a region adjacent to the charge transfer region. In this case, charges collected in the charge collection region may be transferred to the charge transfer region at high speed.

Advantageous Effects of Invention

According to the disclosure, it is possible to provide an optical sensor capable of uniformizing an electric field in an avalanche multiplication region.

BRIEF DESCRIPTION OF DRAWINGS

FIG. 10 is a cross-sectional view taken along the line X-X illustrated in FIG. 9.

DESCRIPTION OF EMBODIMENTS

Hereinafter, an embodiment of the disclosure will be described in detail with reference to the drawings. In the following description, the same reference symbols will be used for the same or equivalent elements, and duplicate description will be omitted.

[Configuration of Photodetector]

Figure 1:
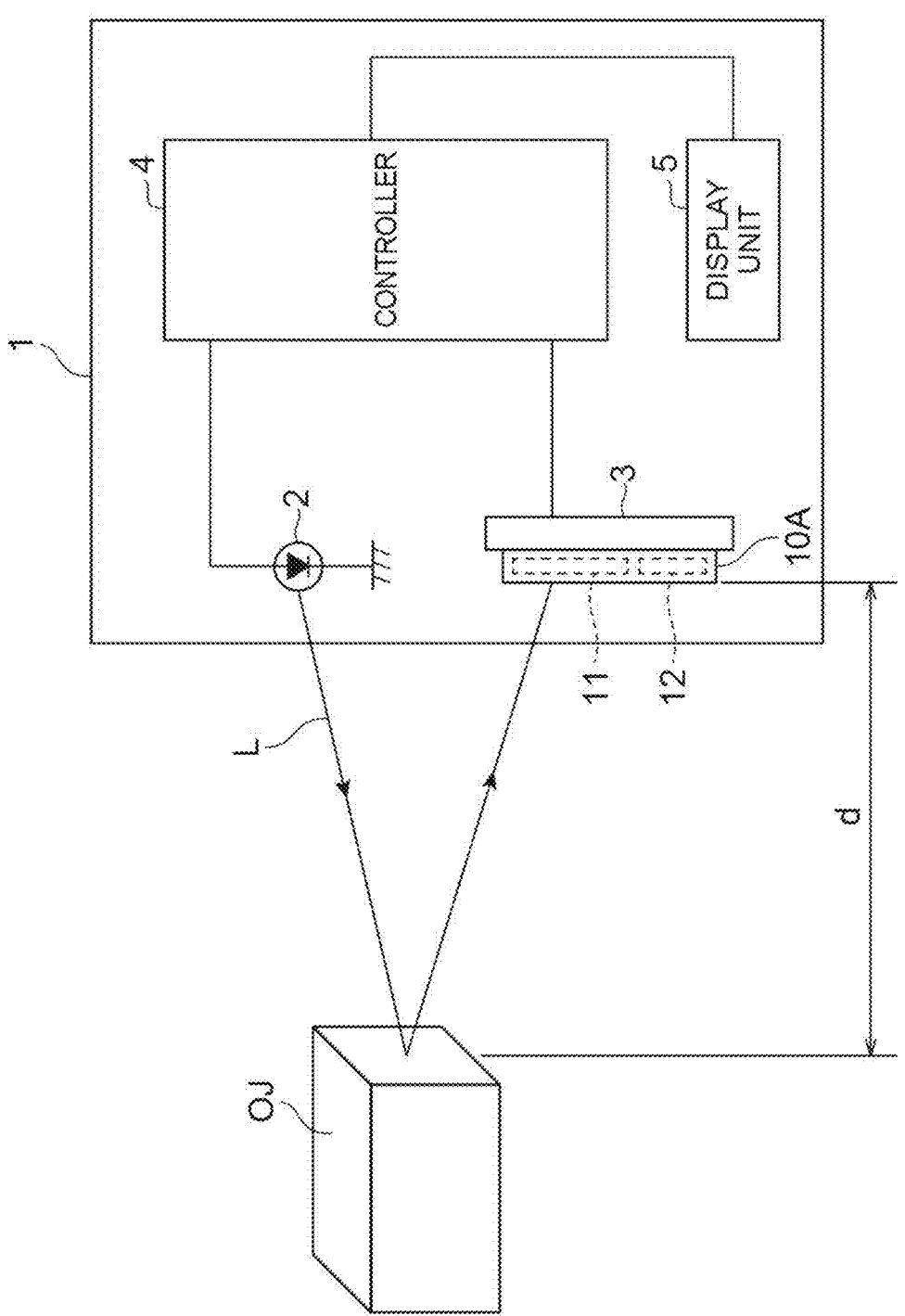
FIG. 1 is a configuration diagram of a photodetector including a rangefinder image sensor according to an embodiment.

As illustrated in FIG. 1, a photodetector 1 includes a light source 2, a rangefinder image sensor (optical sensor) 10A, a signal processing unit 3, a controller 4, and a display unit 5. The photodetector 1 is a device that acquires a distance image of an object OJ (an image including information related to a distance d to the object OJ) by using an indirect TOF (Time of Flight) method.

The light source 2 emits pulsed light L. The light source 2 includes, for example, an infrared LED, etc. The pulsed light L is, for example, near-infrared light, and frequency of the pulsed light L is, for example, 10 kHz or more. The rangefinder image sensor 10A detects the pulsed light L emitted from the light source 2 and reflected by the object OJ. The rangefinder image sensor 10A is configured by monolithically forming a pixel part 11 and a CMOS read circuit part 12 on a semiconductor substrate (for example, a silicon substrate). The rangefinder image sensor 10A is mounted on the signal processing unit 3.

The signal processing unit 3 controls the pixel part 11 and the CMOS read circuit part 12 of the rangefinder image sensor 10A. The signal processing unit 3 performs predetermined processing on a signal output from the rangefinder image sensor 10A to generate a detection signal. The controller 4 controls the light source 2 and the signal processing unit 3. The controller 4 generates a distance image of the object OJ based on a detection signal output from the signal processing unit 3. The display unit 5 displays a distance image of the object OJ generated by the controller 4.

[Configuration of Rangefinder Image Sensor]

Figure 2:
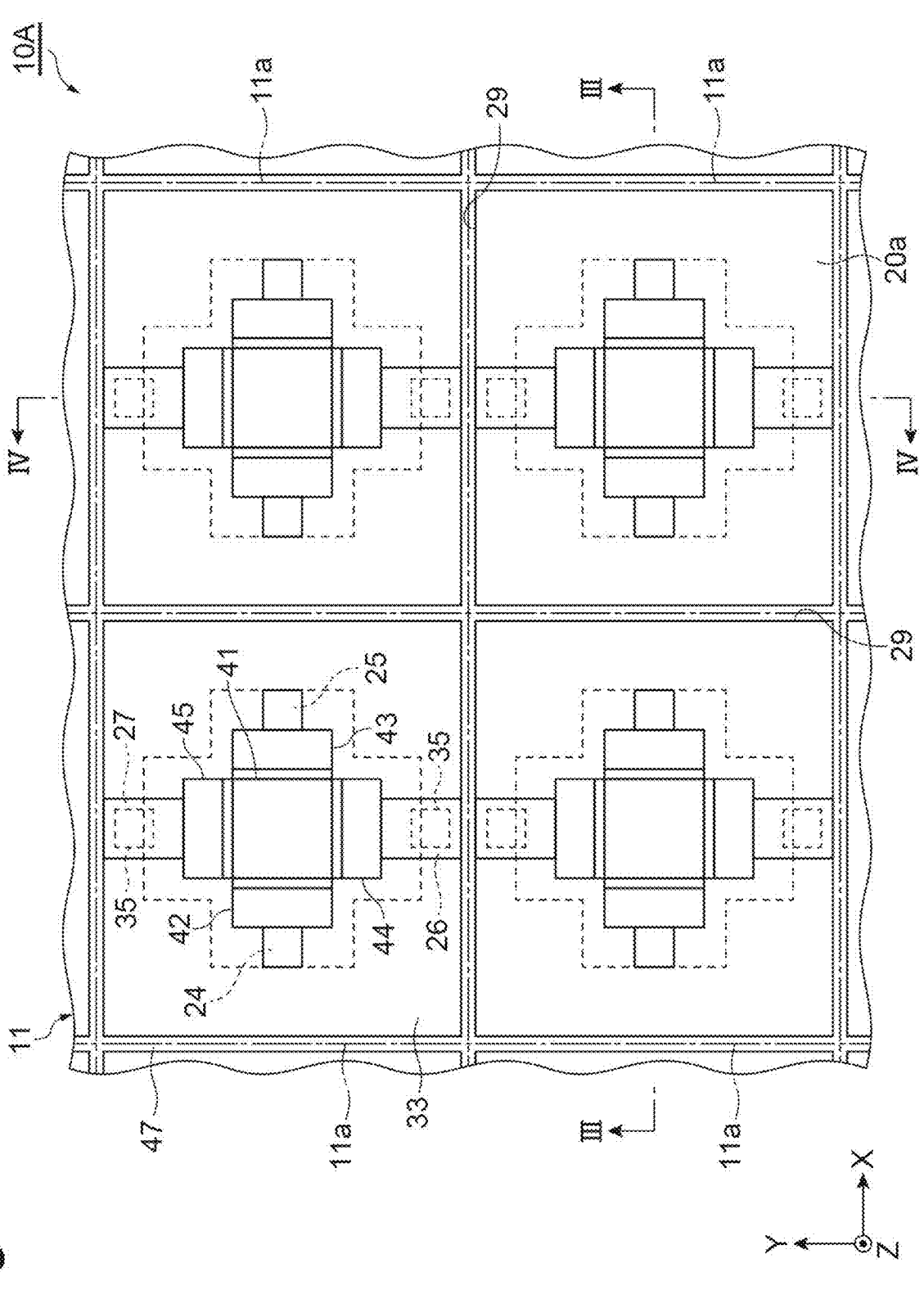
FIG. 2 is a plan view of a pixel part of a rangefinder image sensor.
Figure 3:
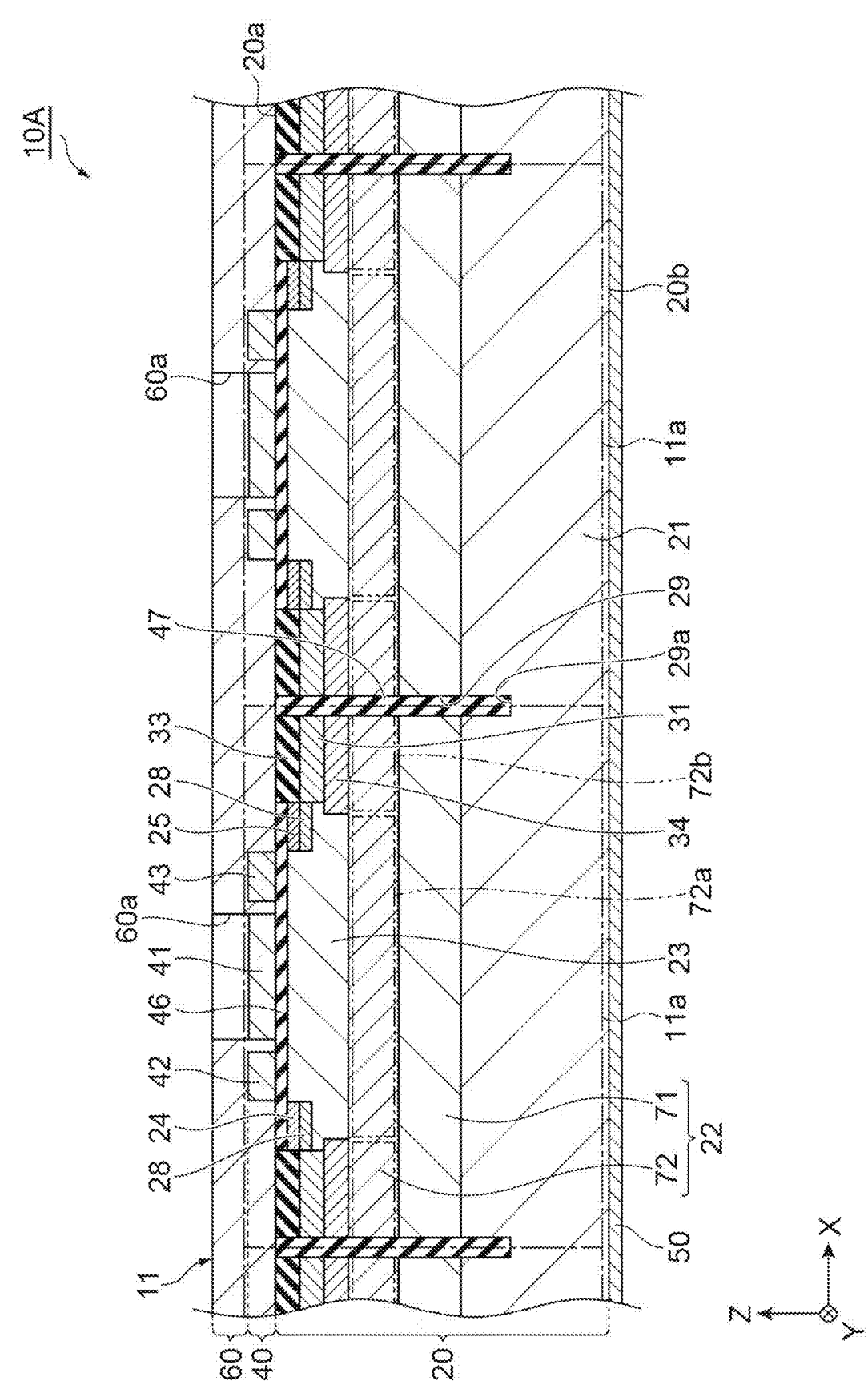
FIG. 3 is a cross-sectional view taken along the line III-III of FIG. 2.
Figure 4:
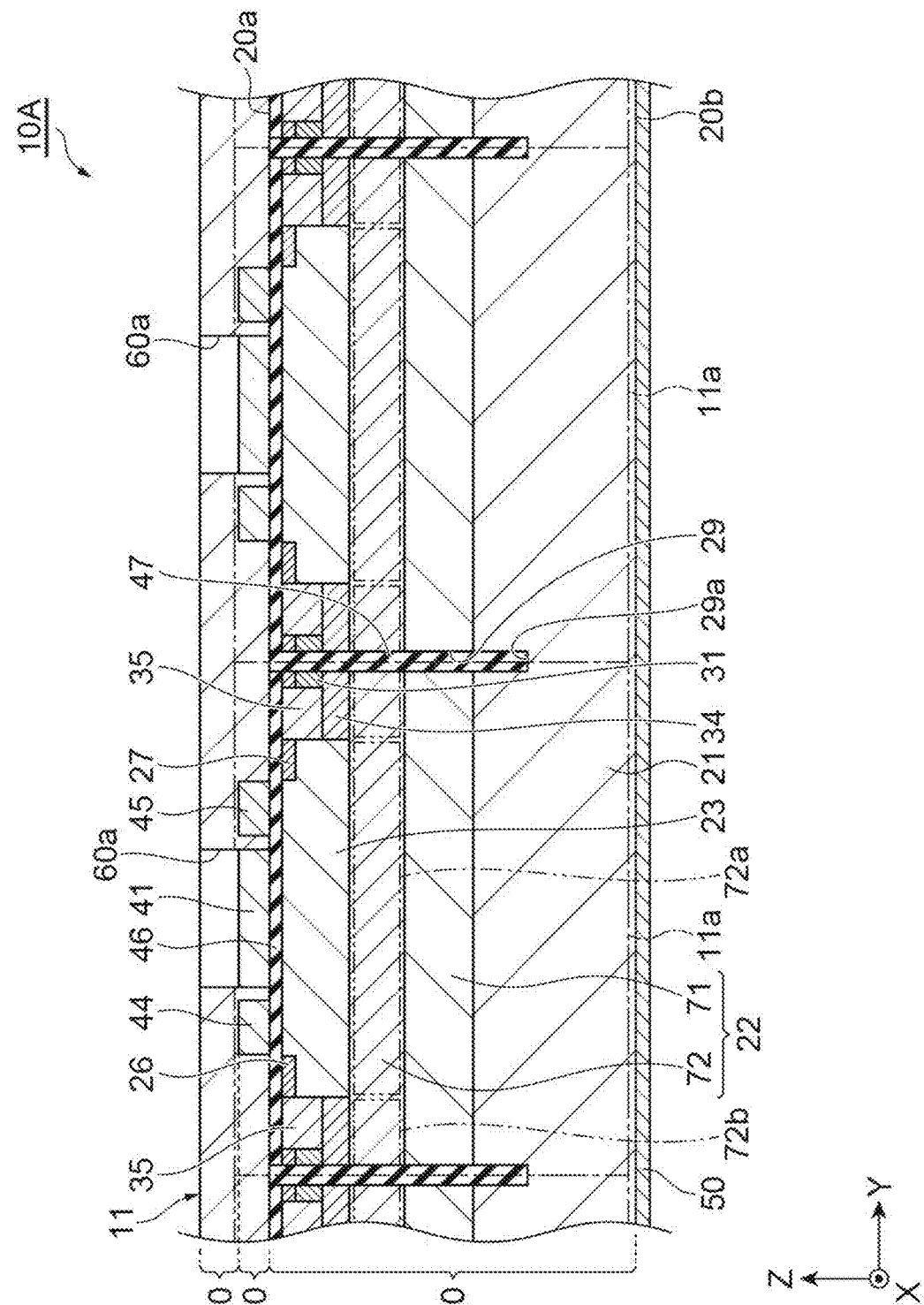
FIG. 4 is a cross-sectional view taken along the line IV-IV of FIG. 2.

As illustrated in FIGS. 2, 3 and 4, the rangefinder image sensor 10A includes a semiconductor layer 20 and an electrode layer 40 in the pixel unit 11. The semiconductor layer 20 has a first surface 20a and a second surface 20b. The first surface 20a is a surface on one side of the semiconductor layer 20 in a thickness direction. The second surface 20b is a surface on the other side of the semiconductor layer 20 in the thickness direction. The electrode layer 40 is provided on the first surface 20a of the semiconductor layer 20. The semiconductor layer 20 and the electrode layer 40 are included in a plurality of pixels 11a disposed along the first surface 20a. In the rangefinder image sensor 10A, the plurality of pixels 11a is arranged two-dimensionally along the first surface 20a. Hereinafter, the thickness direction of the semiconductor layer 20 is referred to as a Z-direction, one direction perpendicular to the Z-direction is referred to as an X-direction, and a direction perpendicular to both the Z-direction and the X-direction is referred to as a Y-direction. Further, one side in the Z-direction is referred to as a first side, and the other side in the Z-direction (the side opposite to the first side) is referred to as a second side. Note that in FIG. 2, illustration of a wiring layer 60, which will be described later, is omitted.

In the semiconductor layer 20, each pixel 11a includes a semiconductor region 21, an avalanche multiplication region 22, a charge collection region 23, a pair of first charge transfer regions 24 and 25, a pair of second charge transfer regions 26 and 27, a plurality of charge blocking regions 28, a well region (first conductive region) 31, a LOCOS (Local Oxidation of Silicon) region 33, a barrier region 34, and a pair of sink regions 35. Each of the regions 21 to 28 and 31 to 35 is formed by performing various treatments (for example, etching, film formation, impurity injection, etc.) on a semiconductor substrate (for example, a silicon substrate).

The semiconductor region 21 is a p-type (first conductive type) region and is provided along the second surface 20b in the semiconductor layer 20. The semiconductor region 21 functions as a light absorption region (photoelectric conversion region) that generates electric charges in response to incident light. As an example, the semiconductor region 21 is a p-type region having the carrier concentration of $1 \times 10^{15}$ cm$^{-3}$ or less, and a thickness thereof is about 10 μm. Note that the avalanche multiplication region 22, etc. functions as a light absorption region (photoelectric conversion region).

The avalanche multiplication region 22 includes a first multiplication region 71 and a second multiplication region 72. Each of the first multiplication region 71 and the second multiplication region 72 is formed in a layer shape along a plane perpendicular to the Z-direction. The first multiplication region 71 and the second multiplication region 72 are arranged along the Z-direction (thickness direction). The first multiplication region 71 is a p-type region and is formed on a first side of the semiconductor region 21 in the semiconductor layer 20. As an example, a thickness of the first multiplication region 71 is about 1 μm. The second multiplication region 72 is an n-type (second conductive type) region, and is formed on the first side of the first multiplication region 71 in the semiconductor layer 20. As an example, a thickness of the second multiplication region 72 is about 1 μm. The first multiplication region 71 and the second multiplication region 72 form a pn junction. Details of the avalanche multiplication region 22 will be described later.

The charge collection region 23 is an n-type region, and is formed on the first side of the second multiplication region 72 in the semiconductor layer 20. As an example, the charge collection region 23 is an n-type region having the carrier concentration of $5 \times 10^{15}$ to $1 \times 10^{16}$ cm$^{-3}$, and a thickness thereof is about 1 μm. In this example, the charge collection region 23 functions as a charge distribution region.

Each of the first charge transfer regions 24 and 25 is an n-type region, and is formed on the first side of the second multiplication region 72 in the semiconductor layer 20. Each of the first charge transfer regions 24 and 25 is connected to the charge collection region 23. The pair of first charge transfer regions 24 and 25 faces each other in the X-direction with a first side portion of the charge collection region 23 interposed therebetween. As an example, each of the first charge transfer regions 24 and 25 is an n-type region having the carrier concentration of $1 \times 10^{18}$ cm$^{-3}$ or more, and a thickness thereof is about 0.2 μm. A second side portion of the charge collection region 23 is inserted between each of the first charge transfer regions 24 and 25 and the second multiplication region 72. In this example, each of the first charge transfer regions 24 and 25 functions as a charge accumulation region.

Each of the second charge transfer regions 26 and 27 is an n-type region, and is formed on the first side of the second multiplication region 72 in the semiconductor layer 20. Each of the second charge transfer regions 26 and 27 is connected to the charge collection region 23. The pair of second charge transfer regions 26 and 27 faces each other in the Y-direction with a first side portion of the charge collection region 23 interposed therebetween. As an example, each of the second charge transfer regions 26 and 27 is an n-type region having the carrier concentration of $1 \times 10^{18}$ cm$^{-3}$ or more, and a thickness thereof is about 0.2 μm. The second side portion of the charge collection region 23 is inserted between each of the second charge transfer regions 26 and 27 and the second multiplication region 72. In this example, each of the second charge transfer regions 26 and 27 functions as a charge discharge region.

Each charge blocking region 28 is a p-type region and is formed between each of the first charge transfer regions 24 and 25 and the charge collection region 23 (the second side portion of the charge collection region 23) in the semiconductor layer 20. As an example, each charge blocking region 28 is a p-type region having the carrier concentration of $1 \times 10^{17}$ to $1 \times 10^{18}$ cm$^{-3}$, and a thickness thereof is about 0.2 μm.

The well region 31 is a p-type region and is formed on the first side of the second multiplication region 72 in the semiconductor layer 20. The well region 31 is disposed to line up with the charge collection region 23 in a direction perpendicular to the Z-direction. In this example, the well region 31 surrounds the charge collection region 23 when viewed in the Z-direction. The LOCOS region 33 is an insulating region formed on the first side of the well region 31 in the semiconductor layer 20. The LOCOS region 33 is connected to the well region 31. The well region 31 and the LOCOS region 33 form a plurality of read circuits (for example, a source follower amplifier, a reset transistor, etc.). Each read circuit is electrically connected to each of the first charge transfer regions 24 and 25.

As an example, the well region 31 is a p-type region having the carrier concentration of $1 \times 10^{16}$ to $5 \times 10^{17}$ cm$^{-3}$, and a thickness thereof is about 1 μm. The well region 31 is also a separation region provided at a boundary portion between the plurality of pixels 11a to separate the plurality of pixels 11a from each other. Note that, as a structure for electrically separating the pixel part and the read circuit part, instead of the LOCOS region 33, STI (Shallow Trench Isolation) may be used, or only the well region 31 may be used.

The barrier region 34 is an n-type region and is formed between the second multiplication region 72 and the well region 31 in the semiconductor layer 20. The barrier region 34 includes the well region 31 when viewed in the Z-direction. That is, the well region 31 is located inside the barrier region 34 when viewed in the Z-direction. The barrier region 34 surrounds the charge collection region 23. The concentration of n-type impurities in the barrier region 34 is higher than the concentration of n-type impurities in the second multiplication region 72. As an example, the barrier region 34 is an n-type region having the carrier concentration in a range from the carrier concentration of the second multiplication region 72 to about twice the carrier concentration of the second multiplication region 72, and a thickness thereof is about 1 μm.

Each sink region 35 is an n-type region and is formed on the first side of the barrier region 34 in the semiconductor layer 20. An end of each sink region 35 on the second side is connected to the barrier region 34. An end of each sink region 35 on the first side is connected to each of the second charge transfer regions 26 and 27. The concentration of n-type impurities in each of the second charge transfer regions 26 and 27 is higher than the concentration of n-type impurities in each sink region 35, and the concentration of n-type impurities in each sink region 35 is higher than the concentration of n-type impurities in the barrier region 34 and the concentration of p-type impurities in the well region 31. As an example, each sink region 35 is an n-type region having the carrier concentration equal to or higher than the carrier concentration of the well region 31, and a thickness thereof depends on the distance between each of the second charge transfer regions 26 and 27 and the barrier region 34.

Each pixel 11a has a photogate electrode 41, a pair of first transfer gate electrodes 42 and 43, and a pair of second transfer gate electrodes 44 and 45 in the electrode layer 40. Each of the gate electrodes 41 to 45 is formed on the first surface 20a of the semiconductor layer 20 via the insulating film 46. The insulating film 46 is, for example, a silicon nitride film, a silicon oxide film, etc.

The photogate electrode 41 is formed on the first side of the charge collection region 23 in the electrode layer 40. The photogate electrode 41 is made of a material having conductivity and light transmittance (for example, polysilicon). As an example, the photogate electrode 41 has a rectangular shape having two sides facing each other in the X-direction and two sides facing each other in the Y-direction when viewed in the Z-direction.

The first transfer gate electrode 42 is formed on the first side of the charge collection region 23 in the electrode layer 40 so as to be located on the first charge transfer region 24 side of the photogate electrode 41. The first transfer gate electrode 42 is disposed on a region adjacent to the first charge transfer region 24 in the charge collection region 23. The first transfer gate electrode 43 is formed on the first side of the charge collection region 23 in the electrode layer 40 so as to be located on the first charge transfer region 25 side of the photogate electrode 41. The first transfer gate electrode 43 is disposed on a region adjacent to the first charge transfer region 25 in the charge collection region 23. Each of the first transfer gate electrodes 42 and 43 is made of a material having conductivity and light transmittance (for example, polysilicon). As an example, each of the first transfer gate electrodes 42 and 43 has a rectangular shape having two sides facing each other in the X-direction and two sides facing each other in the Y-direction when viewed in the Z-direction.

The second transfer gate electrode 44 is formed on the first side of the charge collection region 23 in the electrode layer 40 so as to be located on the second charge transfer region 26 side of the photogate electrode 41. The second transfer gate electrode 44 is disposed on a region adjacent to the second charge transfer region 26 in the charge collection region 23. The second transfer gate electrode 45 is formed on the first side of the charge collection region 23 in the electrode layer 40 so as to be located on the second charge transfer region 27 side of the photogate electrode 41. The second transfer gate electrode 45 is disposed on a region adjacent to the second charge transfer region 27 in the charge collection region 23. Each of the second transfer gate electrodes 44 and 45 is made of a material having conductivity and light transmittance (for example, polysilicon). As an example, each of the second transfer gate electrodes 44 and 45 has a rectangular shape having two sides facing each other in the X-direction and two sides facing each other in the Y-direction when viewed in the Z-direction.

The rangefinder image sensor 10A further includes a counter electrode 50 and a wiring layer 60 in the pixel part 11. The counter electrode 50 is provided on the second surface 20b of the semiconductor layer 20. The counter electrode 50 includes a plurality of pixels 11a when viewed in the Z-direction. The counter electrode 50 faces the electrode layer 40 in the Z-direction. The counter electrode 50 is made of, for example, a metal material. The wiring layer 60 is provided on the first surface 20a of the semiconductor layer 20 so as to cover the electrode layer 40. The wiring layer 60 is electrically connected to each pixel 11a and the CMOS read circuit part 12 (see FIG. 1). A light incident opening 60a is formed in a portion of the wiring layer 60 facing the photogate electrode 41 of each pixel 11a.

A trench 29 is formed in the semiconductor layer 20 so as to separate adjacent pixels 11a from each other. The trench 29 is formed on the first surface 20a of the semiconductor layer 20. A bottom surface 29a of the trench 29 is located on the second side of the avalanche multiplication region 22. That is, the trench 29 completely separates the avalanche multiplication region 22. An insulating material 47 such as silicon oxide is disposed in the trench 29. Instead of the insulating material 47, a metal material such as tungsten, polysilicon, etc. may be disposed in the trench 29.

In each pixel 11a, the avalanche multiplication region 22 reaches the trench 29. The avalanche multiplication region 22 is a region that causes avalanche multiplication. That is, in each pixel 11a, the avalanche multiplication region 22, which may generate an electric field strength of $3 \times 10^5$ to $4 \times 10^5$ V/cm when a reverse bias having a predetermined value is applied, extends over the entire area surrounded by the trench 29.

[Details of Avalanche Multiplication Region]

Each of the first multiplication region 71 and the second multiplication region 72 extends to reach the trench 29 and overlaps the charge collection region 23 and the well region 31 in the Z-direction. The concentration of p-type impurities in the first multiplication region 71 is uniform throughout the first multiplication region 71. The concentration of the p-type impurities in the first multiplication region 71 is, for example, $1 \times 10^{16}$ cm$^{-3}$ or more.

The second multiplication region 72 has a first portion 72a and a second portion 72b in which the concentrations of n-type impurities are different from each other. The first portion 72a overlaps the charge collection region 23 in the Z-direction, and the second portion 72b overlaps the well region 31 in the Z-direction. The first portion 72a is located inside the well region 31 and the barrier region 34 when viewed in the Z-direction, and does not overlap the well region 31 and the barrier region 34 in the Z-direction.

The second portion 72b is continuous with the first portion 72a and surrounds the first portion 72a when viewed in the Z-direction. A portion (inner portion) of the second portion 72b on the first portion 72a side overlaps with the charge collection region 23 in the Z-direction. The entire second portion 72b overlaps the barrier region 34 in the Z-direction. When viewed in the Z-direction, a boundary between the first portion 72a and the second portion 72b coincides with a boundary between the charge collection region 23 and the barrier region 34 (an inner edge of the barrier region 34).

The concentration of n-type impurities in the first portion 72a is higher than the concentration of n-type impurities in the second portion 72b. As an example, the concentration of n-type impurities in the first portion 72a is $1 \times 10^{16}$ or more, and the concentration of n-type impurities in the second portion 72b is $1 \times 10^{16}$ or more. The concentration of n-type impurities in the second portion 72b is set to be high enough to prevent occurrence of a situation (punch-through) in which a current flows between the avalanche multiplication region 22 and the well region 31 due to the depletion layer reaching the well region 31 when a voltage is applied. For example, the avalanche multiplication region 22 is formed by additionally injecting n-type impurities only into the first portion 72a after uniformly forming a region having the concentration of n-type impurities equal to the concentration of n-type impurities in the second portion 72b.

[Operation Example of Photodetector]

In each pixel 11a of the rangefinder image sensor 10A, a negative voltage (for example, −50 V) is applied to the counter electrode 50 with reference to a potential of the photogate electrode 41 (that is, a reverse bias is applied to a pn junction formed in the avalanche multiplication region 22) to generate an electric field strength of $3 \times 10^5$ to $4 \times 10^5$ V/cm in the avalanche multiplication region 22. In this state, when the pulsed light L is incident on the semiconductor layer 20 through the light incident opening 60a and the photogate electrode 41, electrons generated by absorption of the pulsed light L are multiplied in the avalanche multiplication region 22 to move to the charge collection region 23 at high speed (collected in the charge collection region 23).

When generating a distance image of the object OJ (see FIG. 1), first, a reset voltage is applied to each of the pair of second transfer gate electrodes 44 and 45 at each pixel 11a. The reset voltage is a positive voltage with reference to the potential of the photogate electrode 41. As a result, electrons moved to the charge collection region 23 are discharged from the pair of second charge transfer regions 26 and 27.

Subsequently, a pulse voltage signal is applied to each of the pair of first transfer gate electrodes 42 and 43. As an example, the pulse voltage signal applied to the first transfer gate electrode 42 is a voltage signal in which a positive voltage and a negative voltage are alternately repeated with reference to the potential of the photogate electrode 41, and is a voltage signal having the same period, pulse width, and phase as those of an intensity signal of the pulsed light L emitted from the light source 2 (see FIG. 1). Meanwhile, the pulse voltage signal applied to the first transfer gate electrode 43 is the same voltage signal as the pulse voltage signal applied to the first transfer gate electrode 42, except that the phase is shifted by 180°.

As a result, the electrons collected in the charge collection region 23 are alternately transferred to the pair of first charge transfer regions 24 and 25 at high speed (distributed to the pair of first charge transfer regions 24 and 25). The electrons accumulated in the first charge transfer regions 24 and 25 by transfer for a predetermined period are transferred to the CMOS read circuit part 12 (FIG. 1) as a signal via the wiring layer 60 and the read circuit including the well region 31, etc.

As illustrated in FIG. 1, when the pulsed light L is emitted from the light source 2, and the pulsed light L reflected by the object OJ is detected by the rangefinder image sensor 10A, a phase of the intensity signal of the pulsed light L detected by the rangefinder image sensor 10A is shifted from a phase of the intensity signal of the pulsed light L emitted from the light source 2 according to the distance d to the object OJ. Therefore, a distance image of the object OJ may be generated by acquiring a signal based on the electrons accumulated in each of the first charge transfer regions 24 and 25 for each pixel 11a.

[Function and Effect]

In the rangefinder image sensor 10A, the second multiplication region 72 has the first portion 72a that overlaps the charge collection region 23 in the Z-direction (the thickness direction of the first multiplication region 71 and the second multiplication region 72) and the second portion 72b that overlaps the well region 31 (the first conductive region) in the Z-direction, and the concentration of n-type impurities in the first portion 72a is higher than the concentration of n-type impurities in the second portion 72b. In this way, the depletion layer may be easily extended in the first portion 72a, and the electric field generated in the avalanche multiplication region 22 when a voltage is applied may be uniformized.

Figure 5:
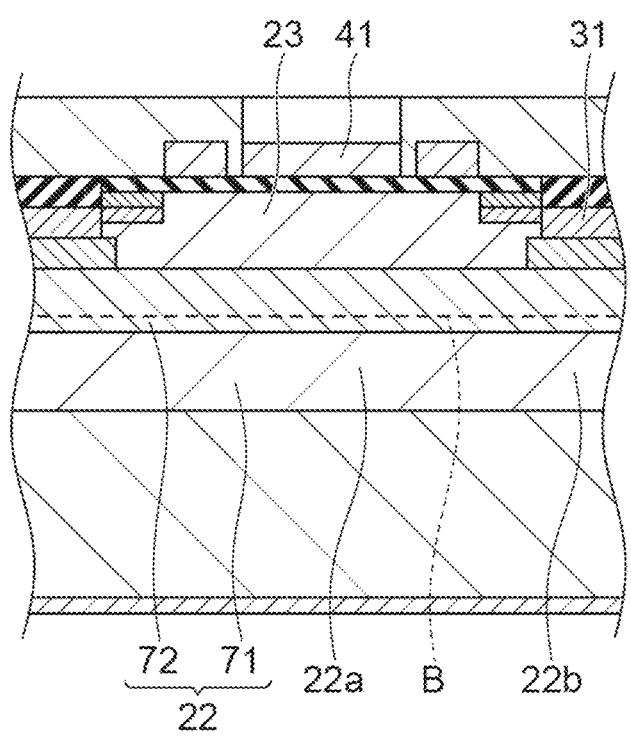
FIGS. 5(a) and 5(b) are diagrams illustrating an electric field generated in an avalanche multiplication region when a voltage is applied.
Figure 5:
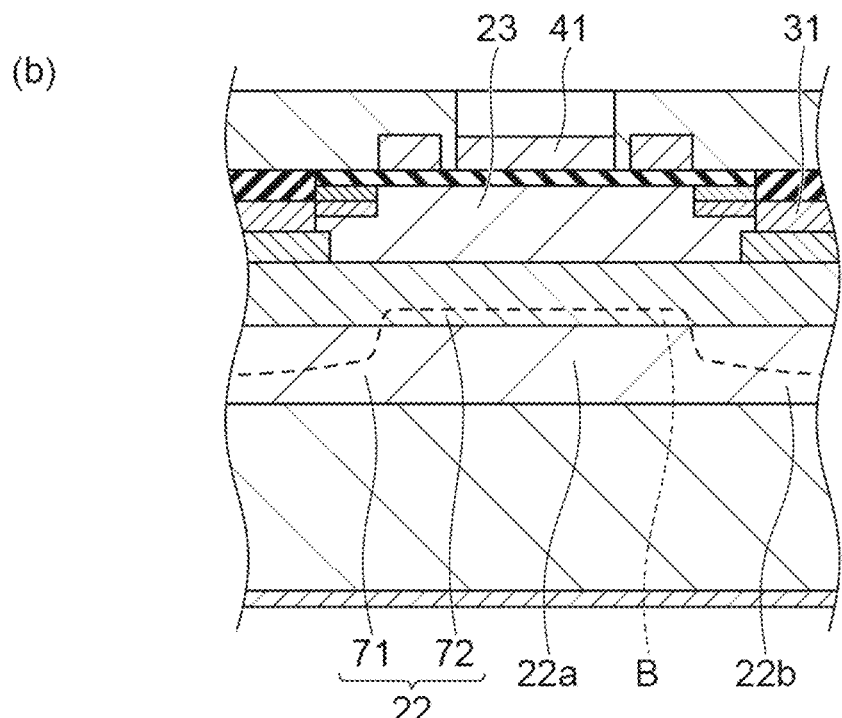
Figure 6:
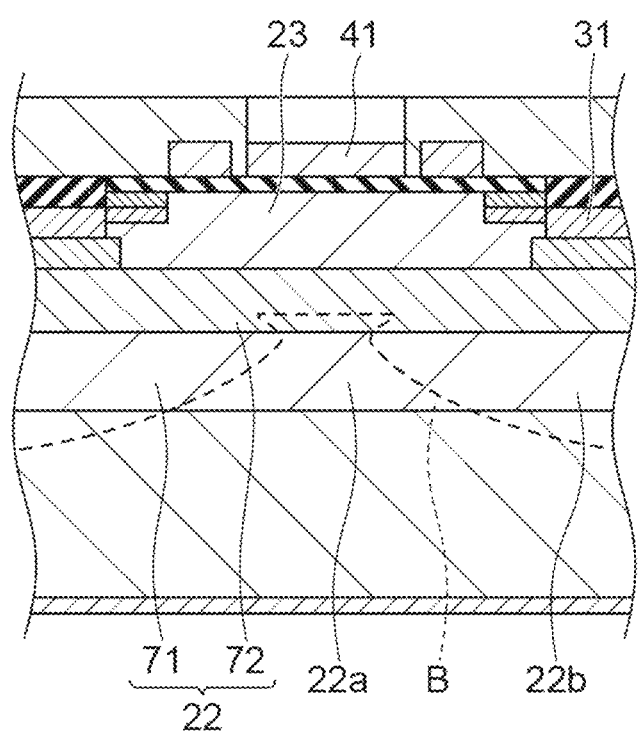
FIGS. 6(a) and 6(b) are diagrams illustrating an electric field generated in the avalanche multiplication region when a voltage is applied.
Figure 6:
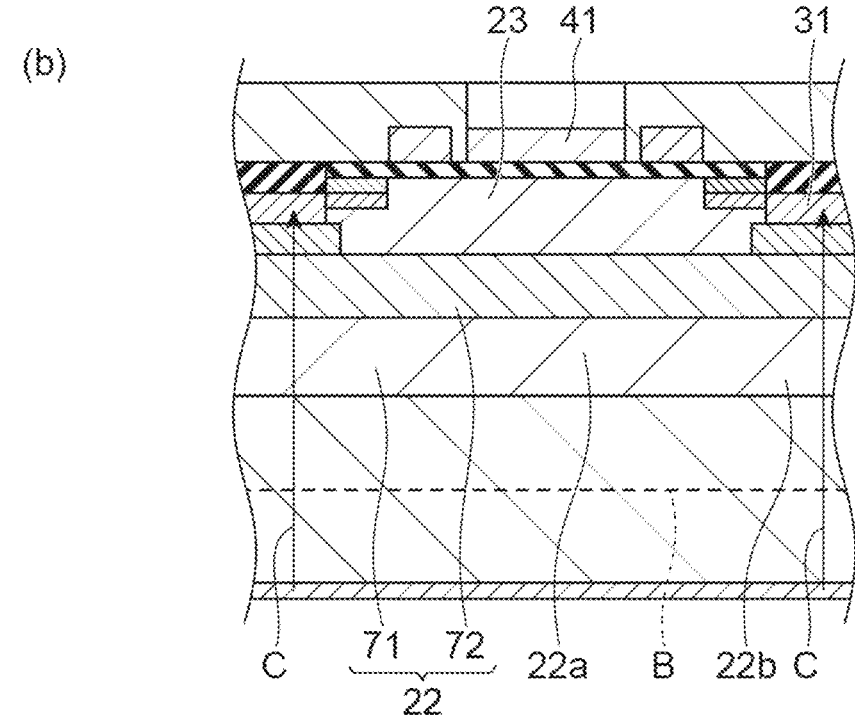

This point will be further described with reference to FIGS. 5 and 6. FIGS. 5 and 6 illustrate simulation results when the concentrations of n-type impurities in the first portion 72a and the second portion 72b of the second multiplication region 72 are equal to each other, unlike the rangefinder image sensor 10A. FIGS. 5(a), 5(b), 6(a), and 6(b) illustrate electric fields generated in the avalanche multiplication region 22 when applied voltages applied to the counter electrode 50 are 30 V, 40 V, 50 V, and 60 V, respectively. In each figure, a boundary (equipotential line) B of the depletion layer is indicated by a broken line. Hereinafter, a description will be given on the assumption that a portion of the avalanche multiplication region 22 overlapping the charge collection region 23 in the Z-direction is set as the first portion 22a, and a portion of the avalanche multiplication region 22 overlapping the well region 31 in the Z-direction is set as the second portion 22b.

As illustrated in FIG. 5(a), when the applied voltage is 30 V, the boundary B of the depletion layer is almost flat. As illustrated in FIG. 5(b), when the applied voltage increases to 40V, a difference in the shape of the depletion layer starts to occur between the first portion 22a and the second portion 22b. In the second portion 22b, the depletion layer is greatly extended when compared to the first portion 22a, and the electric field in the second portion 22b is higher than the electric field in the first portion 22a.

As illustrated in FIG. 6(a), when the applied voltage increases to 50 V, the depletion layer formed in the second portion 22b advances into the first portion 22a. Further, the electric field in the second portion 22b further rises. The first portion 22a is not depleted and the electric field remains low. As illustrated in FIG. 6(b), when the applied voltage increases to 60 V, joint fracture occurs in the second portion 22*b* before the first portion 22*a* is depleted, and a current C flows between the avalanche multiplication region 22 and the well region 31. Note that joint fracture refers to avalanche breakdown caused by applying a high reverse bias voltage to the pn junction.

As described above, when the concentrations of n-type impurities in the first portion 72*a* and the second portion 72*b* of the second multiplication region 72 are equal to each other, the electric field generated in the avalanche multiplication region 22 when a voltage is applied becomes nonuniform, and there is concern that joint fracture may occur when the applied voltage is increased to the extent that avalanche multiplication occurs. On the other hand, in the rangefinder image sensor 10A, the concentration of n-type impurities in the first portion 72*a* is higher than the concentration of n-type impurities in the second portion 72*b*, and thus the depletion layer may be easily extended in the first portion 72*a*, and the electric field generated in the avalanche multiplication region 22 when a voltage is applied may be uniformized (planarized). As a result, even when the applied voltage is increased to the extent that avalanche multiplication occurs, it is possible to prevent joint fracture from occurring in the second portion 72*b*.

The first multiplication region 71 overlaps the charge collection region 23 and the well region 31 in the Z-direction. In this way, the area of the first multiplication region 71 may be ensured, and high sensitivity may be achieved.

The first multiplication region 71 and the second multiplication region 72 reach the trench 29 formed to separate the plurality of pixels 11*a* from each other. In this way, high sensitivity is realized in each pixel 11*a* in a state where variation in light receiving sensitivity among the plurality of pixels 11*a* and variation in light receiving sensitivity depending on the location in one pixel 11*a* are suppressed. As a result, light receiving sensitivity may be uniformly improved in each pixel 11*a*.

The first portion 72*a* does not overlap the well region 31 in the Z-direction. In this way, it is possible to inhibit occurrence of a situation (punch-through) in which a current flows between the avalanche multiplication region 22 and the well region 31 due to the depletion layer reaching the well region 31 when a voltage is applied.

The well region 31 is included in a circuit (pixel circuit). The well region 31 is also a separation region provided at a boundary portion between the plurality of pixels 11*a*. According to the rangefinder image sensor 10A, even when such a well region 31 is provided, the electric field in the avalanche multiplication region 22 may be uniformized.

The well region 31 surrounds the charge collection region 23 when viewed in the Z-direction. According to the rangefinder image sensor 10A, even when such a well region 31 is provided, the electric field in the avalanche multiplication region 22 may be uniformized.

The rangefinder image sensor 10A includes the first charge transfer regions 24 and 25 and the second charge transfer regions 26 and 27 disposed on the first side of the second multiplication region 72 and connected to the charge collection region 23, and the first transfer gate electrodes 42 and 43 and the second transfer gate electrodes 44 and 45 disposed on regions adjacent to the first charge transfer regions 24 and 25 and the second charge transfer regions 26 and 27, respectively, in the charge collection region 23. In this way, the charges collected in the charge collection region 23 may be transferred to the first charge transfer regions 24 and 25 and the second charge transfer regions 26 and 27 at high speed.

FIRST MODIFIED EXAMPLE

Figure 7:
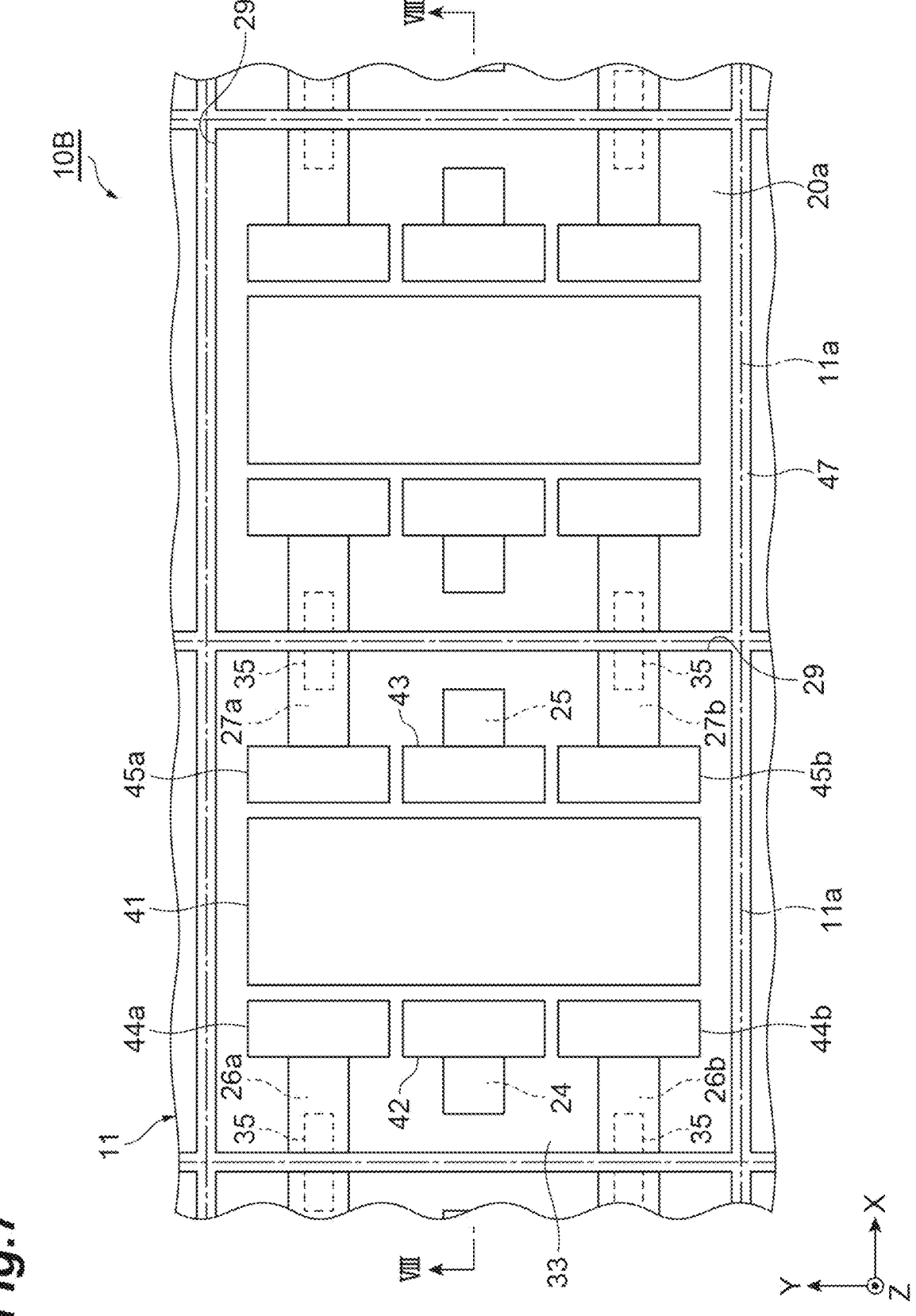
FIG. 7 is a plan view of a rangefinder image sensor according to a first modified example.
Figure 8:
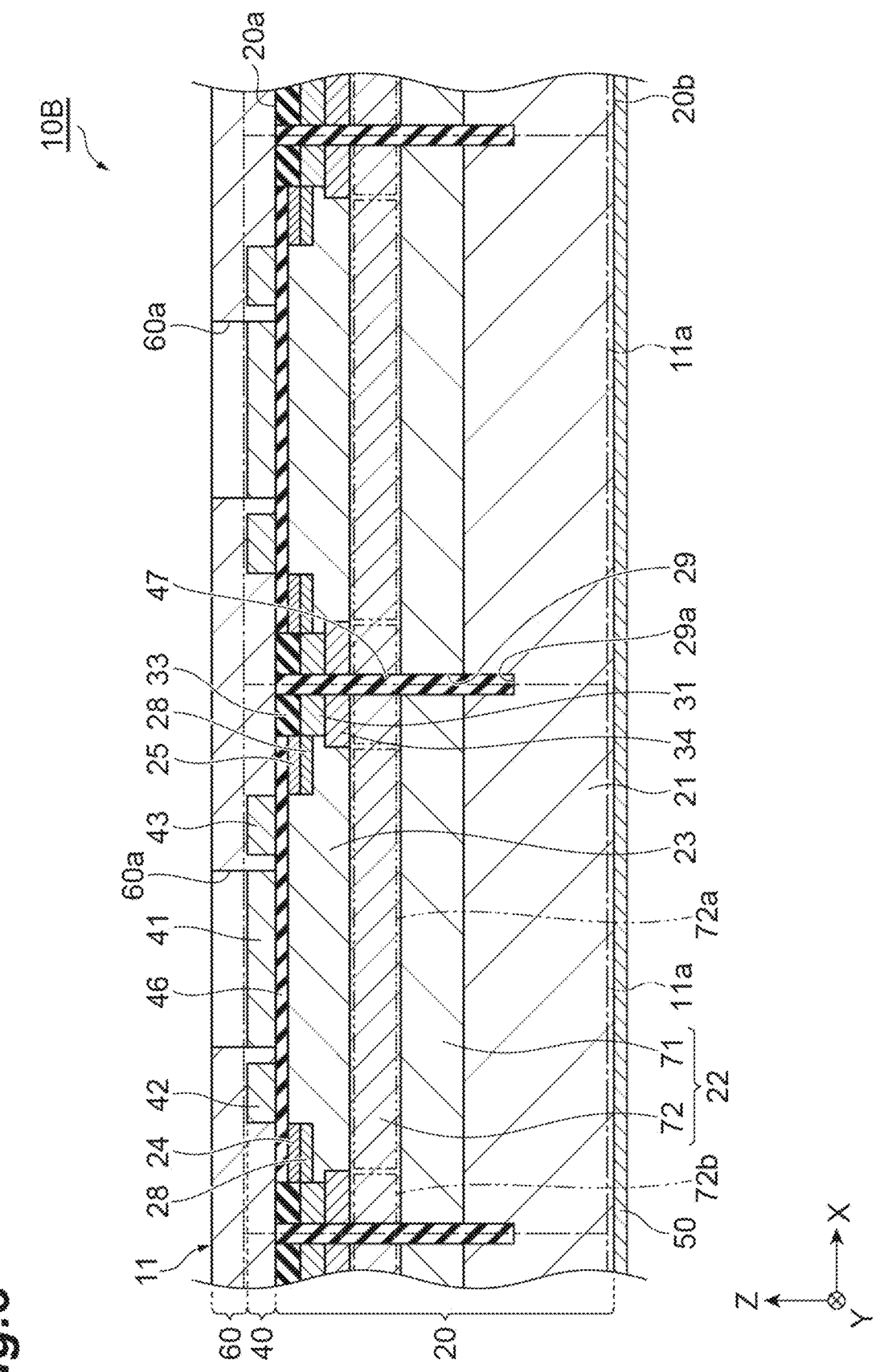
FIG. 8 is a cross-sectional view taken along the line VIII-VIII illustrated in FIG. 7.

A rangefinder image sensor 10B according to a first modified example illustrated in FIGS. 7 and 8 is mainly different from the rangefinder image sensor 10A in that second charge transfer regions 26*a*, 26*b*, 27*a*, and 27*b* are disposed on both sides of the charge collection region 23 in the X-direction, and a plurality of second transfer gate electrodes 44*a*, 44*b*, 45*a*, and 45*b* is disposed on both sides of the photogate electrode 41 in the X-direction.

In each pixel 11*a* of the rangefinder image sensor 10B, the pair of second charge transfer regions 26*a* and 26*b* is disposed on one side of the charge collection region 23 in the X-direction and on both sides of the first charge transfer region 24 in the Y-direction. The pair of second charge transfer regions 27*a* and 27*b* is disposed on the other side of the charge collection region 23 in the X-direction and on both sides of the first charge transfer region 25 in the Y-direction. The second transfer gate electrode 44*a* is disposed between the photogate electrode 41 and the second charge transfer region 26*a* when viewed in the Z-direction. The second transfer gate electrode 44*b* is disposed between the photogate electrode 41 and the second charge transfer region 26*b* when viewed in the Z-direction. The second transfer gate electrode 45*a* is disposed between the photogate electrode 41 and the second charge transfer region 27*a* when viewed in the Z-direction. The second transfer gate electrode 45*b* is disposed between the photogate electrode 41 and the second charge transfer region 27*b* when viewed in the Z-direction.

In the second multiplication region 72 of the rangefinder image sensor 10B, the concentration of n-type impurities in the first portion 72*a* is higher than the concentration of n-type impurities in the second portion 72*b*, similarly to the above-mentioned rangefinder image sensor 10A. As a result, the depletion layer may be easily extended in the first portion 72*a*, and the electric field generated in the avalanche multiplication region 22 when a voltage is applied may be uniformized.

SECOND MODIFIED EXAMPLE

Figure 9:
FIG. 9 is a plan view of a rangefinder image sensor according to a second modified example.
Figure 9:
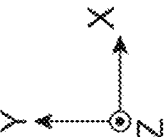
Figure 10:
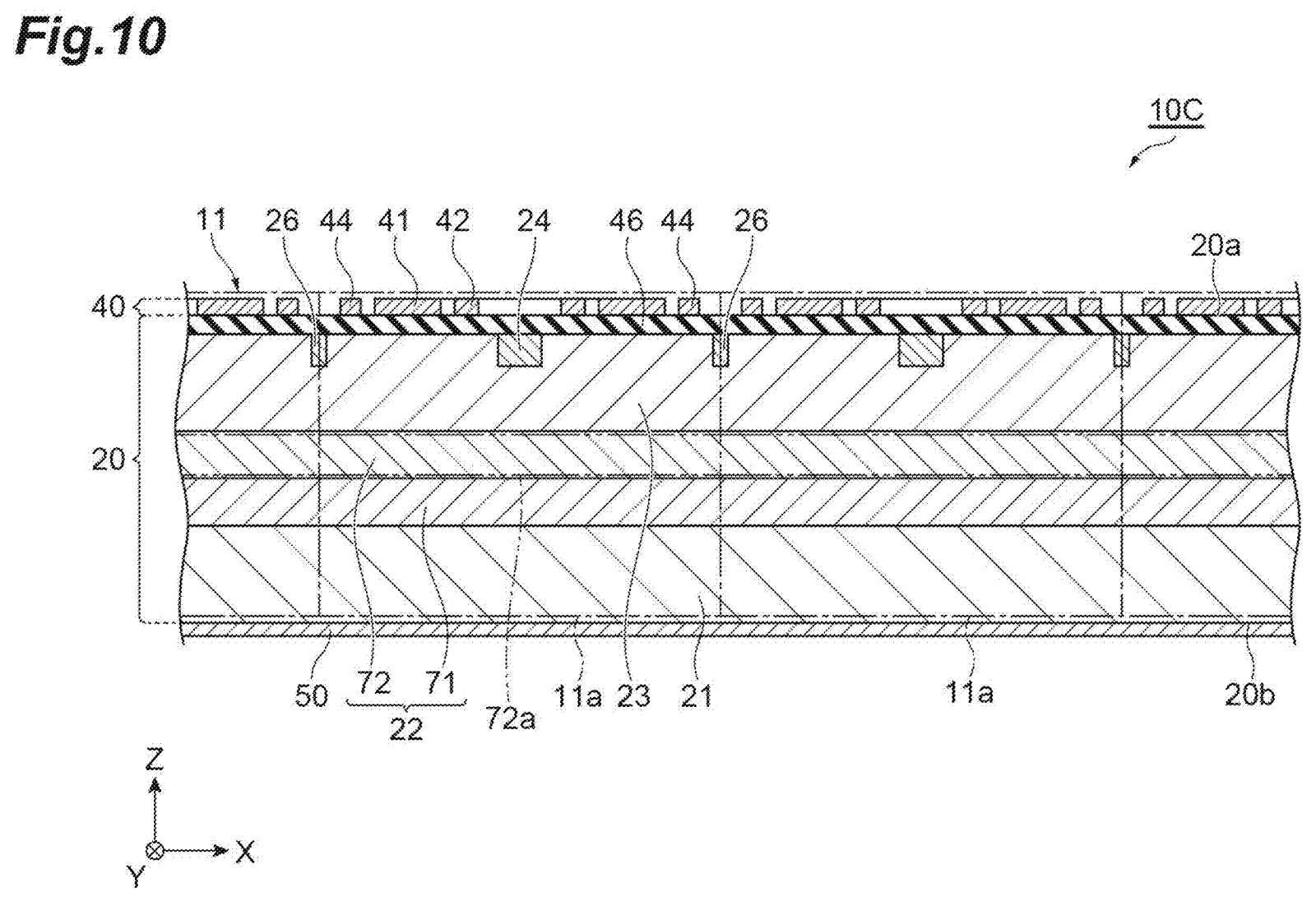
Figure 11:
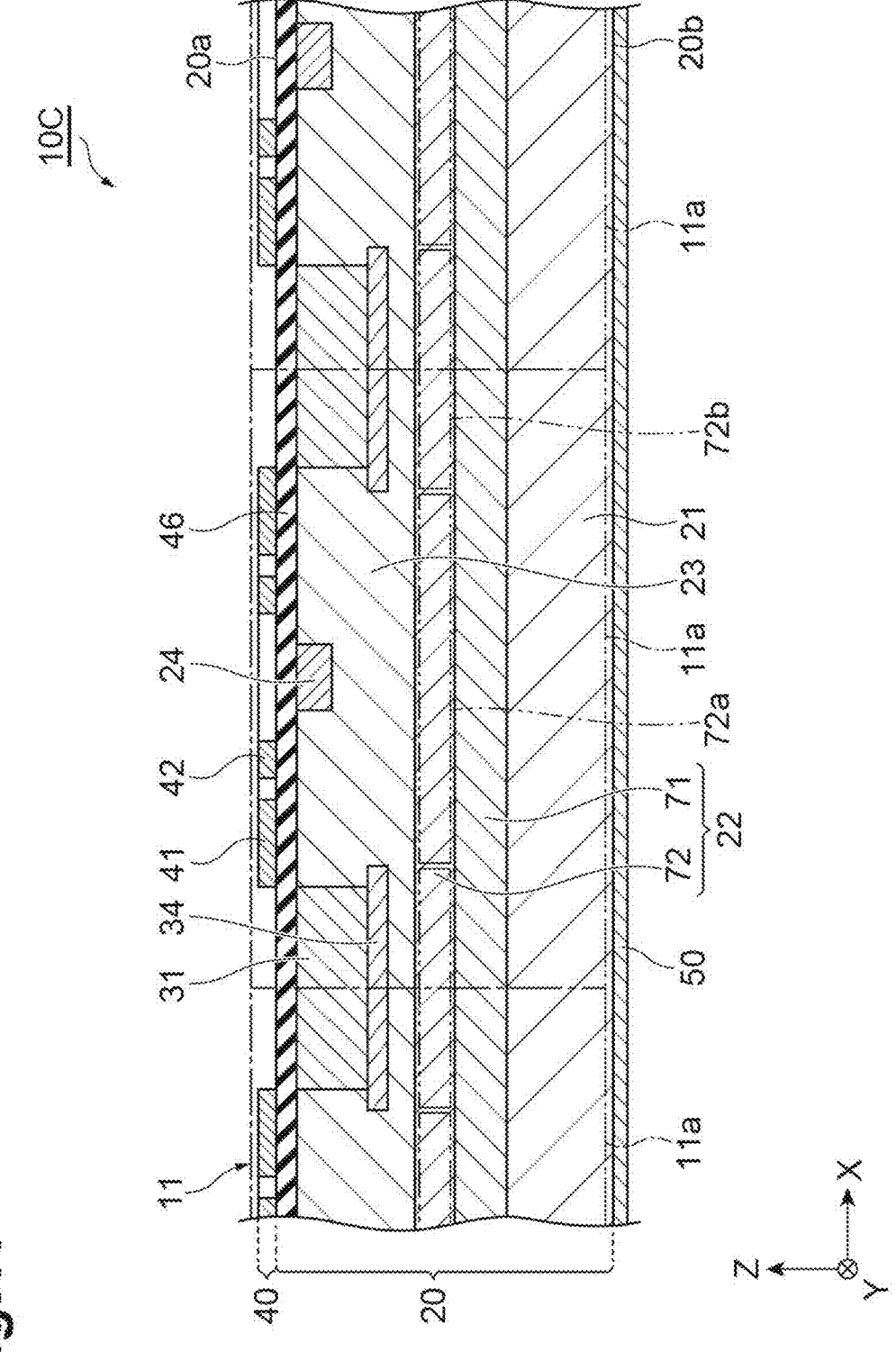
FIG. 11 is a cross-sectional view taken along the line XI-XI illustrated in FIG. 9.

A rangefinder image sensor 10C according to a second modified example illustrated in FIGS. 9, 10, and 11 is mainly different from the rangefinder image sensor 10A in that first charge transfer region 24 is disposed at a center of the charge collection region 23, a plurality of second charge transfer regions 26 is disposed along an outer edge of the charge collection region 23, the photogate electrode 41 and the first transfer gate electrode 42 are formed in an annular shape, a plurality of second transfer gate electrodes 44 is disposed to surround the photogate electrode 41, and the trench 29 is not formed in the semiconductor layer 20 and the avalanche multiplication region 22 is connected to the plurality of pixels 11*a*.

In each pixel 11*a* of the rangefinder image sensor 10C, the first charge transfer region 24 is disposed at the center of the charge collection region 23 when viewed in the Z-direction. The plurality of second charge transfer regions 26 is disposed along the outer edge of the charge collection region 23 when viewed in the Z-direction. Each of the second charge transfer regions 26 is shared by two adjacent pixels 11*a*. The photogate electrode 41 has, for example, a rectangular ring shape when viewed in the Z-direction, and is disposed outside the first charge transfer region 24 and inside the plurality of second charge transfer regions 26. The first transfer gate electrode 42 has, for example, a rectangular ring shape when viewed in the Z-direction, and is disposed outside the first charge transfer region 24 and inside the photogate electrode 41. Each of the second transfer gate electrodes 44 is disposed between the photogate electrode 41 and each of the second charge transfer regions 26 when viewed in the Z-direction.

In each pixel 11a of the rangefinder image sensor 10C, the well region 31 and the barrier region 34 are located on intersections of a plurality of virtual lines disposed in a grid pattern to partition the plurality of pixels 11a when viewed in the Z-direction. Therefore, the trench 29 is not formed in the semiconductor layer 20, and the first multiplication region 71 and the second multiplication region 72 of the avalanche multiplication region 22 are connected across the plurality of pixels 11a. In this example, the well region 31 and the barrier region 34 have a rectangular shape having two sides facing each other in the X-direction and two sides facing each other in the Y-direction when viewed in the Z-direction. The well region 31 does not surround the charge collection region 23 when viewed in the Z-direction. The second portion 72b of the second multiplication region 72 does not surround the first portion 72a when viewed in the Z-direction.

In the second multiplication region 72 of the rangefinder image sensor 10C, the concentration of n-type impurities in the first portion 72a is higher than the concentration of n-type impurities in the second portion 72b, similarly to the above-mentioned rangefinder image sensor 10A. In this way, the depletion layer may be easily extended in the first portion 72a, and the electric field generated in the avalanche multiplication region 22 when a voltage is applied may be uniformized.

In the rangefinder image sensor 10C, each of the first multiplication region 71 and the second multiplication region 72 is connected across the plurality of pixels 11a. In this way, high sensitivity is realized in each pixel 11a in a state where variation in light receiving sensitivity among the plurality of pixels 11a and variation in light receiving sensitivity depending on the location in one pixel 11a are suppressed. As a result, light receiving sensitivity may be uniformly improved in each pixel 11a.

Note that in the rangefinder image sensor 10C, the sink region 35 (see FIG. 3) is not formed in the semiconductor layer 20. A reason therefor is that, in the rangefinder image sensor 10C, the barrier region 34 is separated from the first charge transfer region 24 when compared to the above-mentioned rangefinder image sensor 10A, and as a result, electrons collected around the barrier region 34 rarely enter the first charge transfer region 24.

THIRD MODIFIED EXAMPLE

Figure 12:
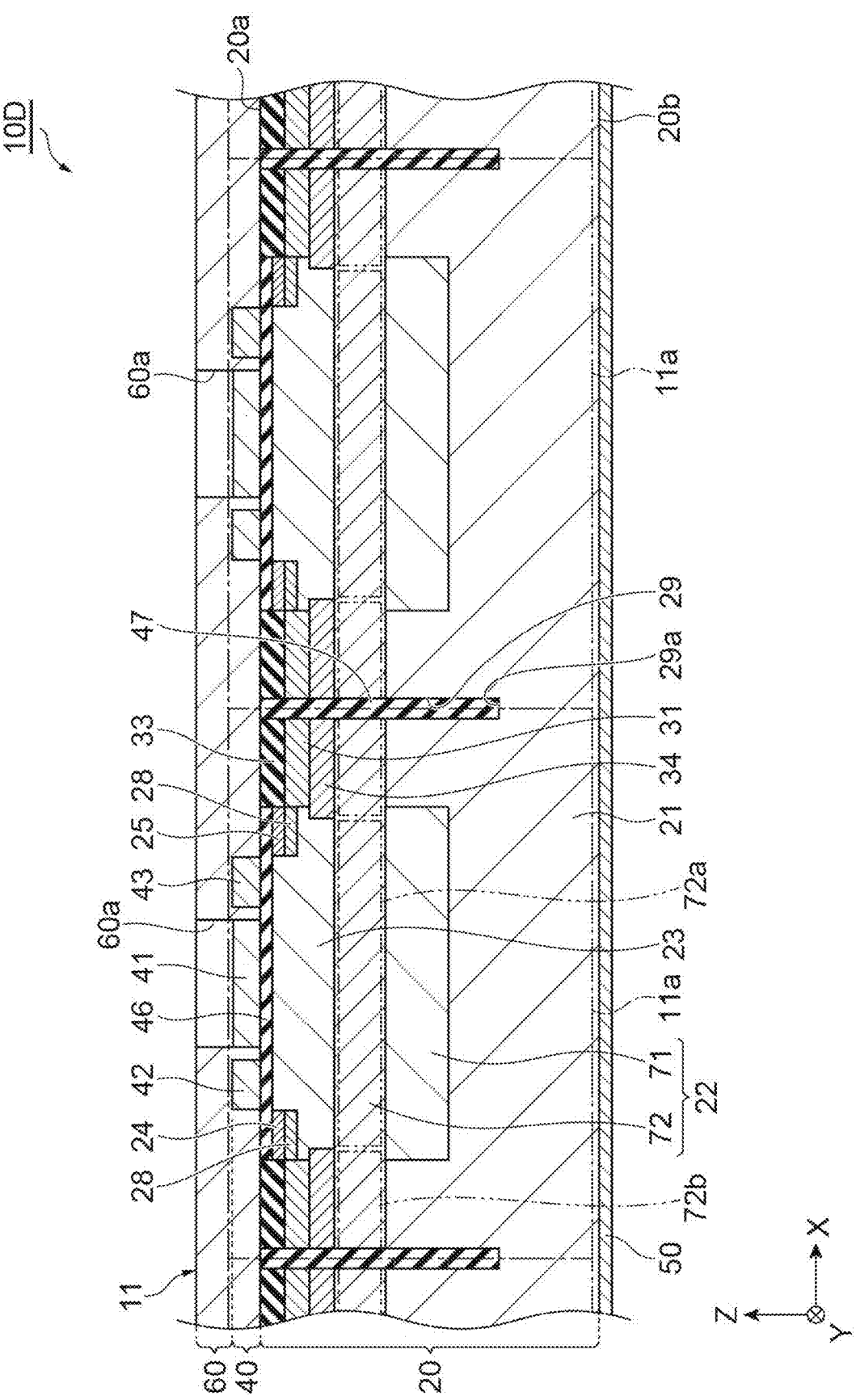
FIG. 12 is a cross-sectional view of a rangefinder image sensor according to a third modified example.

A rangefinder image sensor 10D according to a third modified example illustrated in FIG. 12 is mainly different from the rangefinder image sensor 10A in that the first multiplication region 71 is not connected across the plurality of pixels 11a and does not reach the trench 29. That is, the first multiplication region 71 is separately provided for each pixel 11a. The first multiplication region 71 overlaps the charge collection region 23 in the Z-direction, and does not overlap the well region 31.

In the second multiplication region 72 of the rangefinder image sensor 10D, the concentration of n-type impurities in the first portion 72a is higher than the concentration of n-type impurities in the second portion 72b, similarly to the above-mentioned rangefinder image sensor 10A. In this way, the depletion layer may be easily extended in the first portion

72a, and the electric field generated in the avalanche multiplication region 22 when a voltage is applied may be uniformized.

In the rangefinder image sensor 10D, the first multiplication region 71 does not overlap the well region 31 in the Z-direction. In this way, when a voltage is applied, the depletion layer formed in the first portion 72a of the second multiplication region 72 is less likely to extend toward the well region 31, and the depletion layer is prevented from reaching the well region 31. That is, it is possible to prevent a current from flowing between the avalanche multiplication region 22 and the well region 31 due to the depletion layer reaching the well region 31.

FOURTH MODIFIED EXAMPLE

Figure 13:
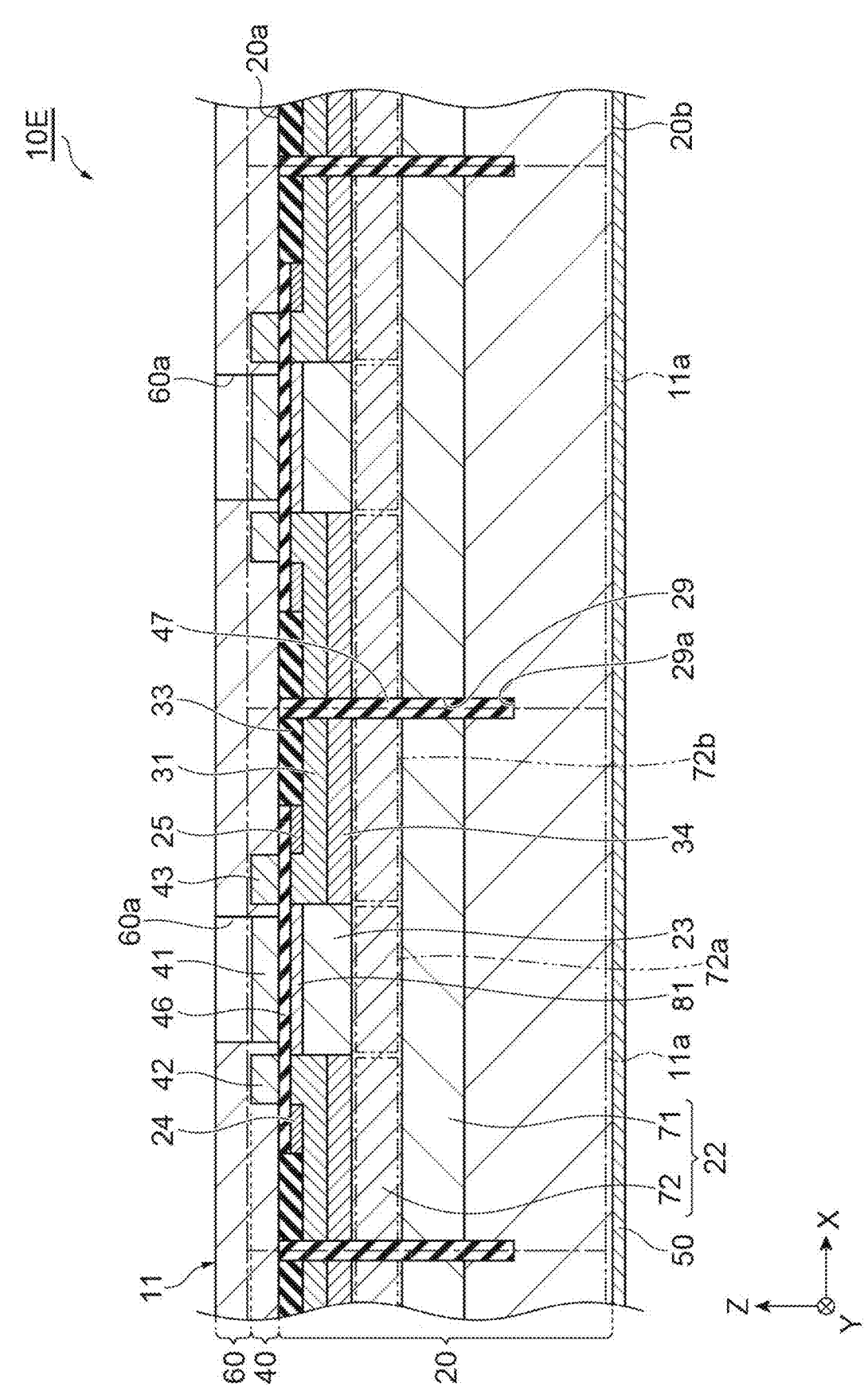
FIG. 13 is a cross-sectional view of a rangefinder image sensor according to a fourth modified example.

A rangefinder image sensor 10E according to a fourth modified example illustrated in FIG. 13 is mainly different from the rangefinder image sensor 10A in the following points. That is, in the rangefinder image sensor 10E, the first charge transfer regions 24 and 25 are embedded in well regions 31. The first charge transfer regions 24 and 25 are formed in the well regions 31 and are separated from the charge collection region 23 by the well regions 31. The first transfer gate electrodes 42 and 43 are disposed on a region adjacent to the first charge transfer regions 24 and 25 in the well regions 31.

The first portion 72a of the second multiplication region 72 overlaps the charge collection region 23 in the Z-direction and does not overlap the well regions 31. The second portion 72b overlaps the well regions 31 and the barrier region 34 in the Z-direction. The second portion 72b surrounds the charge collection region 23 when viewed in the Z-direction, and does not overlap the charge collection region 23 in the Z-direction. The charge blocking region 28 is not provided.

The rangefinder image sensor 10E includes an intervening region 81 disposed between the charge collection region 23 and the photogate electrode 41 in the semiconductor layer 20. The intervening region 81 is, for example, a p-type region having the carrier concentration of $5 \times 10^{15}$ cm$^{-3}$ or more. The carrier concentration in the intervening region 81 is higher than the carrier concentration in the charge collection region 23. The intervening region 81 is formed in a layer shape along a direction perpendicular to the Z-direction and extends between the well regions 31.

In the second multiplication region 72 of the rangefinder image sensor 10E, the concentration of n-type impurities in the first portion 72a is higher than the concentration of n-type impurities in the second portion 72b, similarly to the above-mentioned rangefinder image sensor 10A. In this way, the depletion layer may be easily extended in the first portion 72a, and the electric field generated in the avalanche multiplication region 22 when a voltage is applied may be uniformized. Further, the intervening region 81 is disposed between the charge collection region 23 and the photogate electrode 41. In this way, generation of dark current around the photogate electrode 41 may be suppressed.

FIFTH MODIFIED EXAMPLE

Figure 14:
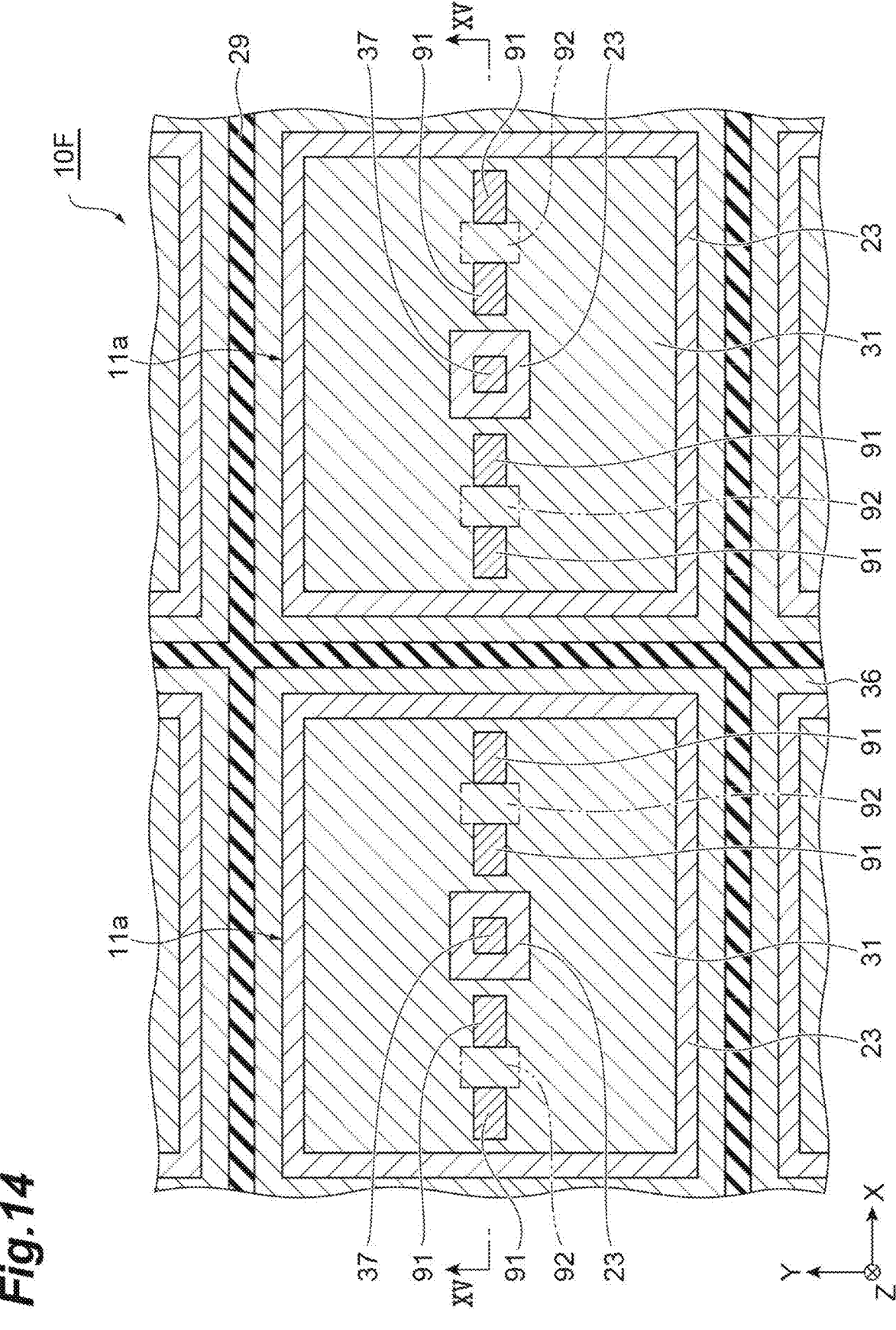
FIG. 14 is a cross-sectional view of a semiconductor layer of an image sensor according to a fifth modified example.
Figure 15:
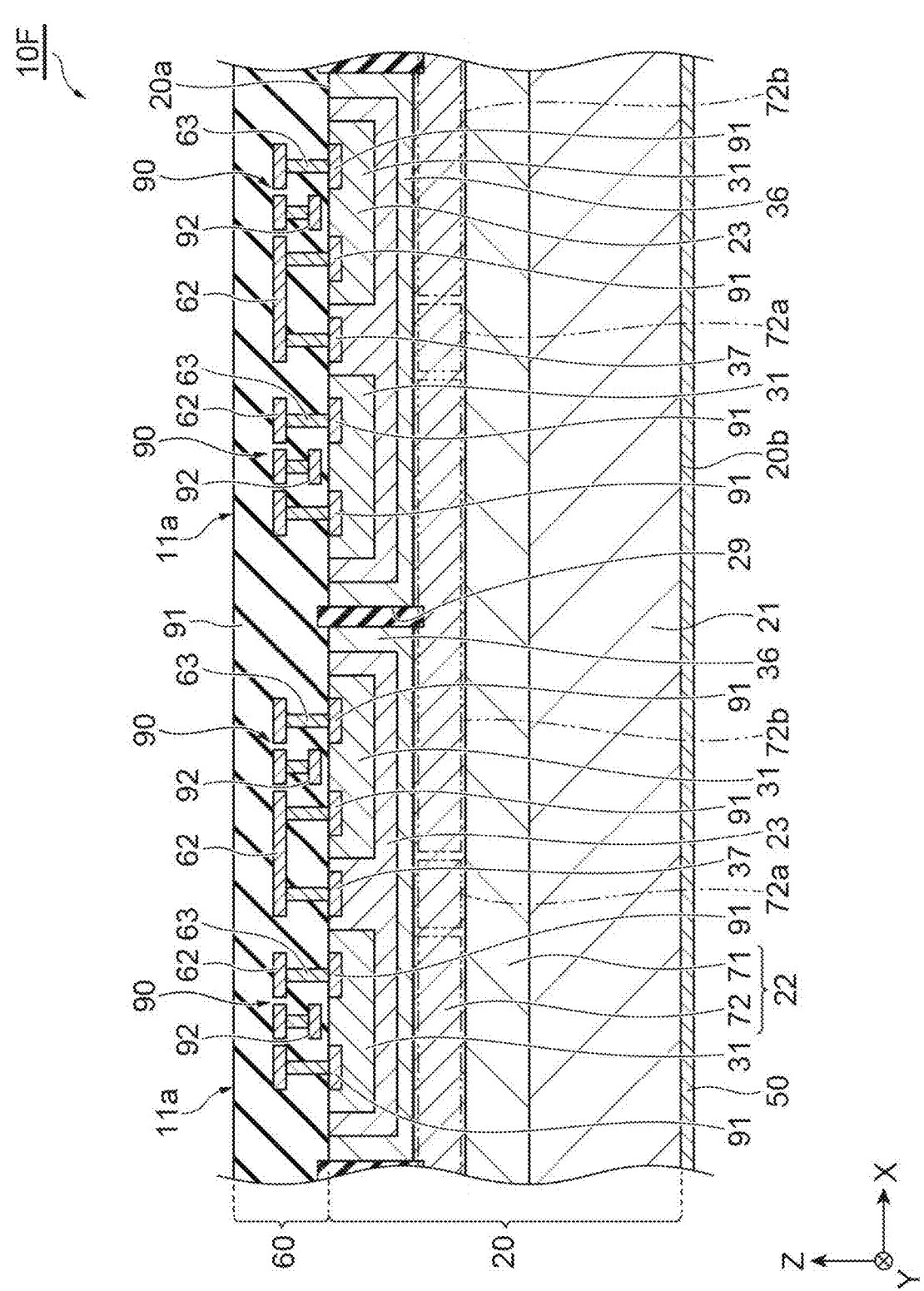
FIG. 15 is a cross-sectional view taken along the line XV-XV illustrated in FIG. 14.

In an image sensor 10F according to a fifth modified example illustrated in FIGS. 14 and 15, each pixel 11a does not have the first charge transfer regions 24 and 25, the second charge transfer regions 26 and 27, the charge blocking region 28, the LOCOS region 33, the barrier region 34, and the sink region 35, and has a semiconductor region 36 and a read region 37.

The semiconductor region 36 is a p-type region, and is formed on the first side of the avalanche multiplication region 22 of the second multiplication region 72 in the semiconductor layer 20. As an example, the semiconductor region 36 is a p-type region having the carrier concentration of $1 \times 10^{15}$ cm$^{-3}$ or less. The charge collection region 23 is covered by the semiconductor region 36 except for the first surface 20$a$ side.

The read region 37 is an n-type region, and is formed along the first surface 20$a$ in the center of the charge collection region 23 when viewed in the Z-direction. As an example, the impurity concentration of the read region 37 is $1 \times 10^{16}$ cm$^{-3}$ or more, and a thickness thereof is about 0.5 μm.

The well region 31 is formed in the charge collection region 23 to reach the first surface 20$a$, and is covered by the charge collection region 23 except for the first surface 20$a$ side. The well region 31 is included in a portion of a pixel circuit 90. The pixel circuit 90 is an n-type MOSFET (metal-oxide-semiconductor field-effect transistor) having a pair of channel regions (source region and drain region) 91 and a gate electrode 92 formed in the well region 31. The pixel circuit 90 is included in a transistor for reading a signal charge flowing into the charge collection area 23 via the read region 37, an amplification transistor, a reset transistor, etc. The pixel circuit 90 may be a JFET (junction field-effect transistor), a bipolar transistor, etc.

The image sensor 10F does not include the electrode layer 40. A wiring layer 60 of the image sensor 10F has an insulating layer 61, a plurality of wirings 62, and a plurality of contact plugs 63. The plurality of wirings 62 and the plurality of contact plugs 63 are formed in the insulating layer 61. The read area 37 is electrically connected to a corresponding wiring 62 via a contact plug 63. Each part of the pixel circuit 90 is electrically connected to the corresponding wiring 62 via the contact plug 63. Each wiring 62 is electrically connected to, for example, a read circuit part of the image sensor 10F.

The trench 29 is formed to penetrate the semiconductor region 36. One end of the trench 29 is located inside the insulating layer 61 of the wiring layer 60. The other end of the trench 29 is located inside the second multiplication region 72 of the avalanche multiplication region 22. That is, the trench 29 does not completely separate the avalanche multiplication region 22. The trench 29 is formed by, for example, STI.

In the image sensor 10F, the counter electrode 50 is made of a material having light transmittance, and light is incident on the semiconductor layer 20 via the counter electrode 50. A charge generated in the semiconductor layer 20 is multiplied in the avalanche multiplication region 22, and a multiplied signal charge flows into the charge collection region 23 and is read by the plurality of pixel circuits 90 via the read region 37. The image sensor 10F is an optical sensor that does not detect the pulsed light L emitted from the light source 2 and reflected by the object OJ unlike the rangefinder image sensor 10A described above, and detects light coining from the outside. Note that the image sensor 10F may be configured so that light is incident from the first side instead of the second side. In this case, the counter electrode 50 does not have to have light transmittance.

In the image sensor 10F, each of the first multiplication region 71 and the second multiplication region 72 is connected across the plurality of pixels 11$a$. The first portion 72$a$ of the second multiplication region 72 overlaps a portion of the charge collection region 23 located between the well regions 31. The first portion 72$a$ does not overlap the well region 31 in the Z-direction. The second portion 72$b$ overlaps the well region 31 in the Z-direction and surrounds the first portion 72$a$ when viewed in the Z-direction. The second portion 72$b$ overlaps an outer portion of the charge collection region 23 in the Z-direction. When viewed in the Z-direction, a boundary between the first portion 72$a$ and the second portion 72$b$ coincides with a boundary between the charge collection region 23 and the well region 31 (an inner edge of the well region 31).

In the second multiplication region 72 of the rangefinder image sensor 10F, the concentration of n-type impurities in the first portion 72$a$ is higher than the concentration of n-type impurities in the second portion 72$b$, similarly to the above-mentioned rangefinder image sensor 10A. In this way, the depletion layer may be easily extended in the first portion 72$a$, and the electric field generated in the avalanche multiplication region 22 when a voltage is applied may be uniformized.

SIXTH MODIFIED EXAMPLE

Figure 16:
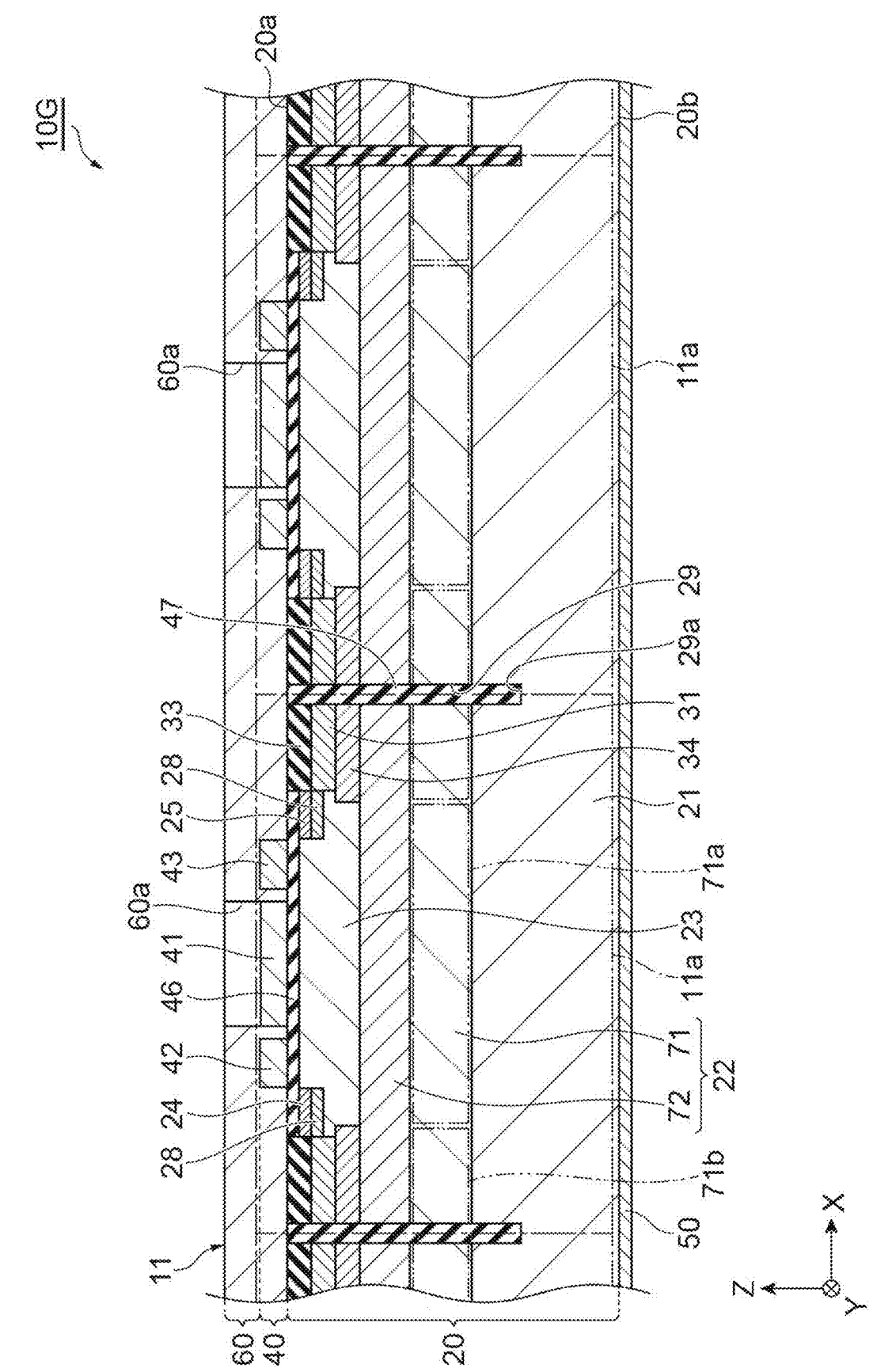
FIG. 16 is a cross-sectional view of a rangefinder image sensor according to a sixth modified example.

A rangefinder image sensor 10G of a sixth modified example illustrated in FIG. 16 is mainly different from the above-mentioned rangefinder image sensor 10A in the following points. That is, the concentration of n-type impurities in the second multiplication region 72 is uniform throughout the second multiplication region 72. The concentration of n-type impurities in the second multiplication region 72 is, for example, $1 \times 10^{16}$ cm$^{-3}$ or more.

The first multiplication region 71 has a first portion 71$a$ and a second portion 71$b$ in which the concentrations of p-type impurities are different from each other. The first portion 71$a$ overlaps the charge collection region 23 in the Z-direction, and the second portion 71$b$ overlaps the well region 31 in the Z-direction. The first portion 71$a$ is located inside the well region 31 and the barrier region 34 when viewed in the Z-direction, and does not overlap the well region 31 and the barrier region 34 in the Z-direction.

The second portion 71$b$ is continuous with the first portion 71$a$ and surrounds the first portion 71$a$ when viewed in the Z-direction. A portion (inner portion) of the second portion 71$b$ on the first portion 71$a$ side overlaps the charge collection region 23 in the Z-direction. The entire second portion 71$b$ overlaps the barrier region 34 in the Z-direction. When viewed in the Z-direction, a boundary between the first portion 71$a$ and the second portion 71$b$ coincides with a boundary between the charge collection region 23 and the barrier region 34 (the inner edge of the barrier region 34).

The concentration of p-type impurities in the second portion 71$b$ is higher than the concentration of p-type impurities in the first portion 71$a$. As an example, the concentration of p-type impurities in the second portion 71$b$ is $1 \times 10^{16}$ or more, and the concentration of p-type impurities in the first portion 71$a$ is $1 \times 10^{16}$ or more.

In the rangefinder image sensor 10G, the concentration of p-type impurities in the second portion 71$b$ is higher than the concentration of p-type impurities in the first portion 71$a$. In this way, extension of the depletion layer may be suppressed in the second portion 71$b$, and the electric field generated in the avalanche multiplication region 22 when a voltage is applied may be uniformized as in the above-mentioned rangefinder image sensor 10A. Note that, in the rangefinder image sensor 10G, the first multiplication region 71 (second portion 71$b$) does not have to reach the trench 29.

In the rangefinder image sensors 10B, 10C, and 10E and the image sensor 10F described above, similarly to the rangefinder image sensor 10G, the concentration of n-type impurities in the second multiplication region 72 may be uniform over the entire second multiplication region 72, and the concentration of p-type impurities in the second portion 71*b* may be higher than the concentration of p-type impurities in the first portion 71*a* in the first multiplication region 71. Even in this case, the electric field generated in the avalanche multiplication region 22 when a voltage is applied may be uniformized.

The disclosure is not limited to the above embodiments and modified examples. For example, a material and shape of each configuration is not limited to the above-mentioned material and shape, and various materials and shapes may be adopted. In the rangefinder image sensor 10A, the second multiplication region 72 (the second portion 72*b*) does not have to reach the trench 29.

It is sufficient that the rangefinder image sensor 10A has a p-type region (a first conductive region having a first conductive type) disposed on the first side of the second multiplication region 72, and the well region 31 does not have to form a circuit. For example, the rangefinder image sensor 10A may include a first conductive region which is a separation region provided at a boundary portion between the plurality of pixels 11*a* instead of the well region 31. In this case, a substrate on which a pixel circuit is built may be attached or connected by a wire to the rangefinder image sensor 10A. This point is the same for the rangefinder image sensors 10B to 10E, and 10G and the image sensor 10F.

In any of the rangefinder image sensors 10A to 10E, and 10G, it is sufficient that one pixel 11*a* is provided with at least one first charge transfer region, at least one second charge transfer region, at least one first transfer gate electrode, and at least one second transfer gate electrode, and a method of applying voltages to the first transfer gate electrode and the second transfer gate electrode, and a method of extracting and discharging charges from the first charge transfer region and the second charge transfer region are not limited to those described above. In any of the rangefinder image sensors 10A to 10E, and 10G, the second charge collection region and the second transfer gate electrode do not have to be provided.

In any of the rangefinder image sensors 10A to 10E, and 10G and the image sensor 10F, the conductive types of p-type and n-type may be opposite to those described above. The plurality of pixels 11*a* may be one-dimensionally arranged along the first surface 20*a* of the semiconductor layer 20. Only a single pixel 11*a* may be provided. In any of the rangefinder image sensors 10A to 10E and the image sensor 10F, the first portion 72*a* of the second multiplication region 72 may overlap the well region 31 in the Z-direction. For example, the first portion 72*a* may be formed so that an outer edge of the first portion 72*a* overlaps the well region 31 in the Z-direction. In this case, the electric field in the avalanche multiplication region 22 may be further uniformized. Similarly, in the rangefinder image sensor 10G, the first portion 71*a* of the first multiplication region 71 may overlap the well region 31 in the Z-direction.

REFERENCE SIGNS LIST

10A to 10E, 10G: rangefinder image sensor (optical sensor), 10F: image sensor (optical sensor), 11*a*: pixel, 22: avalanche multiplication region, 23: charge collection region, 29: trench, 31: well region (first conductive region), 71: first multiplication region, 71*a*: first portion, 71*b*: second portion, 72: second multiplication region, 72*a*: first portion, 72*b*: second portion, 81: intervening region.

The invention claimed is:

1. An optical sensor comprising:
an avalanche multiplication region including a first multiplication region having a first conductive type and a second multiplication region having a second conductive type, each of the first multiplication region and the second multiplication region being formed in a layer shape, wherein the avalanche multiplication region is configured to cause avalanche multiplication when a reverse bias having a predetermined value is applied;
a charge collection region having the second conductive type disposed on a first side of the second multiplication region when a side at which the second multiplication region is located with respect to the first multiplication region in a thickness direction of the first multiplication region and the second multiplication region is set as the first side, wherein electrons multiplied in the avalanche multiplication region are collected in the charge collection region; and
a first conductive region having the first conductive type disposed on the first side of the second multiplication region,
wherein the second multiplication region includes a first portion overlapping the charge collection region in the thickness direction and a second portion overlapping the first conductive region in the thickness direction; and
a concentration of impurities in the first portion is higher than a concentration of impurities in the second portion.

2. The optical sensor according to claim 1, wherein the first multiplication region overlaps the charge collection region and the first conductive region in the thickness direction.

3. The optical sensor according to claim 1, comprising a plurality of pixels, each of the pixels including the avalanche multiplication region, the charge collection region, and the first conductive region,
wherein the first multiplication region is connected across the plurality of pixels or reaches a trench formed so as to separate the plurality of pixels from each other.

4. The optical sensor according to claim 1, comprising a plurality of pixels, each of the pixels including the avalanche multiplication region, the charge collection region, and the first conductive region,
wherein the second multiplication region is connected across the plurality of pixels or reaches a trench formed so as to separate the plurality of pixels from each other.

5. The optical sensor according to claim 1, wherein the first portion does not overlap the first conductive region in the thickness direction.

6. The optical sensor according to claim 1, wherein the first portion overlaps the first conductive region in the thickness direction.

7. The optical sensor according to claim 1, wherein the first conductive region is a well region that forms a circuit.

8. The optical sensor according to claim 1, comprising a plurality of pixels, each of the pixels including the avalanche multiplication region, the charge collection region, and the first conductive region,
wherein the first conductive region is a separation region provided at a boundary portion between the plurality of pixels.

9. The optical sensor according to claim 1, wherein the first conductive region surrounds the charge collection region when viewed in the thickness direction.

10. The optical sensor according to claim 1, further comprising:

an electrode disposed on the first side of the charge collection region; and an intervening region having the first conductive type disposed between the charge collection region and the electrode.

11. The optical sensor according to claim 1, further comprising:

a charge transfer region having the second conductive type disposed on the first side of the second multiplication region; and a transfer gate electrode disposed on a region adjacent to the charge transfer region.

12. An optical sensor comprising:

an avalanche multiplication region including a first multiplication region having a first conductive type and a second multiplication region having a second conductive type, each of the first multiplication region and the second multiplication region being formed in a layer shape;

a charge collection region having the second conductive type disposed on a first side of the second multiplication region when a side at which the second multiplication region is located with respect to the first multiplication region in a thickness direction of the first multiplication region and the second multiplication region is set as the first side; and a first conductive region having the first conductive type disposed on the first side of the second multiplication region, wherein the first multiplication region includes a first portion overlapping the charge collection region in the thickness direction of the first multiplication region and the second multiplication region and a second portion overlapping the first conductive region in the thickness direction; and a concentration of impurities in the second portion is higher than a concentration of impurities in the first portion.

13. The optical sensor according to claim 12, wherein the second multiplication region overlaps the charge collection region and the first conductive region in the thickness direction.

14. The optical sensor according to claim 12, comprising a plurality of pixels, each of the pixels including the avalanche multiplication region, the charge collection region, and the first conductive region, wherein the first multiplication region is connected across the plurality of pixels or reaches a trench formed so as to separate the plurality of pixels from each other.

15. The optical sensor according to claim 12, comprising a plurality of pixels, each of the pixels including the avalanche multiplication region, the charge collection region, and the first conductive region, wherein the second multiplication region is connected across the plurality of pixels or reaches a trench formed so as to separate the plurality of pixels from each other.

16. The optical sensor according to claim 12, wherein the first portion does not overlap the first conductive region in the thickness direction.

17. The optical sensor according to claim 12, wherein the first portion overlaps the first conductive region in the thickness direction.

18. The optical sensor according to claim 12, wherein the first conductive region is a well region that forms a circuit.

19. The optical sensor according to claim 12, comprising a plurality of pixels, each of the pixels including the avalanche multiplication region, the charge collection region, and the first conductive region, wherein the first conductive region is a separation region provided at a boundary portion between the plurality of pixels.

20. The optical sensor according to claim 12, wherein the first conductive region surrounds the charge collection region when viewed in the thickness direction.

21. The optical sensor according to claim 12, further comprising:

an electrode disposed on the first side of the charge collection region; and an intervening region having the first conductive type disposed between the charge collection region and the electrode.

22. The optical sensor according to claim 12, further comprising:

a charge transfer region having the second conductive type disposed on the first side of the second multiplication region; and a transfer gate electrode disposed on a region adjacent to the charge transfer region.

* * * * *